US008673679B2

(12) United States Patent
Gallazzo et al.

(10) Patent No.: US 8,673,679 B2
(45) Date of Patent: Mar. 18, 2014

(54) ENHANCED VISION SYSTEM FOR SCREEN PRINTING PATTERN ALIGNMENT

(75) Inventors: Marco Gallazzo, Padua (IT); Timothy W. Weidman, Sunnyvale, CA (US); Andrea Baccini, Mignagola di Carbonera (IT); Sunhom (Steve) Paak, Saratoga, CA (US); Hongbin Fang, Mountain View, CA (US); Zhenhua Zhang, Newark, CA (US)

(73) Assignee: Applied Materials Italia S.R.L., San Biagio di Callalta, Treviso (IT)

( * ) Notice: Subject to any disclaimer, the term of this patent is extended or adjusted under 35 U.S.C. 154(b) by 110 days.

(21) Appl. No.: 13/133,919

(22) PCT Filed: Oct. 2, 2009

(86) PCT No.: PCT/US2009/059453
§ 371 (c)(1),
(2), (4) Date: Oct. 20, 2011

(87) PCT Pub. No.: WO2010/068331
PCT Pub. Date: Jun. 17, 2010

(65) Prior Publication Data
US 2012/0040490 A1 Feb. 16, 2012

Related U.S. Application Data

(60) Provisional application No. 61/121,537, filed on Dec. 10, 2008.

(30) Foreign Application Priority Data

Jun. 22, 2009 (IT) ................. UD2009A0119

(51) Int. Cl.
*H01L 21/00* (2006.01)

(52) U.S. Cl.
USPC .............. 438/87; 438/57; 438/98; 427/8

(58) Field of Classification Search
USPC .................... 438/57, 87, 98; 427/8
See application file for complete search history.

(56) References Cited

U.S. PATENT DOCUMENTS 4,234,352 A 11/1980 Swanson
4,315,097 A 2/1982 Solomon
(Continued)

FOREIGN PATENT DOCUMENTS

JP 05029639 A 2/1993
JP 05-308148 A 11/1993
(Continued)

OTHER PUBLICATIONS

PCT International Search Report and Written Opinion dated Apr. 21, 2010 for International Application No. PCT/US2009/059453.

(Continued)

*Primary Examiner* — Kimberly Rizkallah
*Assistant Examiner* — Caleb Henry
(74) *Attorney, Agent, or Firm* — Patterson & Sheridan, LLP

(57) ABSTRACT

Embodiments of the invention also generally provide a solar cell formation process that includes the formation of metal contacts over heavily doped regions that are formed in a desired pattern on a surface of a substrate. Embodiments of the invention also provide an inspection system and supporting hardware that is used to reliably position a similarly shaped, or patterned, metal contact structure on the patterned heavily doped regions to allow an Ohmic contact to be made. The metal contact structure, such as fingers and busbars, are formed on the heavily doped regions so that a high quality electrical connection can be formed between these two regions.

27 Claims, 25 Drawing Sheets

(56) References Cited

U.S. PATENT DOCUMENTS

| | | | |
|---|---|---|---|
| 4,927,770 | A | 5/1990 | Swanson |
| 5,057,439 | A | 10/1991 | Swanson et al. |
| 5,060,065 | A | 10/1991 | Wasserman |
| 5,226,361 | A * | 7/1993 | Grant et al. ............... 101/44 |
| 5,245,421 | A | 9/1993 | Robertson et al. |
| 5,461,002 | A | 10/1995 | Safir |
| 5,517,235 | A | 5/1996 | Wasserman |
| 5,589,233 | A | 12/1996 | Law et al. |
| 5,709,905 | A * | 1/1998 | Shaw et al. ................. 427/8 |
| 5,862,973 | A | 1/1999 | Wasserman |
| 5,961,742 | A | 10/1999 | Tange et al. |
| 6,137,178 | A | 10/2000 | Park |
| 6,222,630 | B1 | 4/2001 | Wasserman |
| 6,448,105 | B1 | 9/2002 | Sterk |
| 6,524,880 | B2 | 2/2003 | Moon et al. |
| 6,815,001 | B1 * | 11/2004 | Mishima et al. ............. 427/8 |
| 6,998,288 | B1 | 2/2006 | Smith et al. |
| 7,135,350 | B1 | 11/2006 | Smith et al. |
| 7,171,897 | B2 * | 2/2007 | Barajas et al. ............. 101/129 |
| 7,339,110 | B1 | 3/2008 | Mulligan et al. |
| 7,388,147 | B2 | 6/2008 | Mulligan et al. |
| 7,455,787 | B2 | 11/2008 | Rose et al. |
| 7,468,485 | B1 | 12/2008 | Swanson |
| 7,633,006 | B1 | 12/2009 | Swanson |
| 7,670,937 | B2 | 3/2010 | Veschetti et al. |
| 7,682,970 | B2 * | 3/2010 | Grigoropoulos et al. ..... 438/662 |
| 7,741,225 | B2 | 6/2010 | Rohatgi et al. |
| 7,842,596 | B2 | 11/2010 | Rohatgi et al. |
| 7,883,343 | B1 | 2/2011 | Mulligan et al. |
| 7,888,168 | B2 | 2/2011 | Weidman et al. |
| 7,897,867 | B1 | 3/2011 | Mulligan et al. |
| 7,951,637 | B2 | 5/2011 | Weidman et al. |
| 8,008,208 | B2 | 8/2011 | Stewart et al. |
| 8,008,575 | B2 | 8/2011 | De Ceuster et al. |
| 8,053,867 | B2 | 11/2011 | Huang et al. |
| 8,059,280 | B2 | 11/2011 | Fisher et al. |
| 2002/0164556 | A1 | 11/2002 | Huffman |
| 2003/0127124 | A1 | 7/2003 | Jones et al. |
| 2004/0112426 | A1 | 6/2004 | Hagino |
| 2004/0131758 | A1 * | 7/2004 | Jung et al. ................... 427/8 |
| 2004/0200520 | A1 | 10/2004 | Mulligan et al. |
| 2005/0022861 | A1 | 2/2005 | Rose et al. |
| 2005/0247674 | A1 | 11/2005 | Kubelbeck et al. |
| 2005/0268963 | A1 | 12/2005 | Jordan et al. |
| 2007/0151598 | A1 | 7/2007 | De Ceuster et al. |
| 2007/0256728 | A1 | 11/2007 | Cousins |
| 2008/0076203 | A1 | 3/2008 | Ribeyron et al. |
| 2009/0068783 | A1 | 3/2009 | Borden |
| 2009/0077805 | A1 | 3/2009 | Bachrach et al. |
| 2009/0139568 | A1 | 6/2009 | Weidman et al. |
| 2009/0142880 | A1 | 6/2009 | Weidman et al. |
| 2009/0280597 | A1 | 11/2009 | Wijekoon et al. |
| 2010/0000597 | A1 | 1/2010 | Cousins |
| 2010/0015751 | A1 | 1/2010 | Weidman et al. |
| 2010/0015756 | A1 | 1/2010 | Weidman et al. |
| 2010/0051085 | A1 | 3/2010 | Weidman et al. |
| 2010/0055822 | A1 | 3/2010 | Weidman et al. |
| 2010/0087028 | A1 * | 4/2010 | Porthouse et al. .............. 438/61 |
| 2011/0104850 | A1 | 5/2011 | Weidman et al. |
| 2011/0136286 | A1 | 6/2011 | Stewart et al. |
| 2011/0183458 | A1 | 7/2011 | Weidman et al. |
| 2011/0240114 | A1 | 10/2011 | Stewart et al. |
| 2011/0272008 | A1 | 11/2011 | Mungekar et al. |
| 2011/0272024 | A1 | 11/2011 | Choi et al. |
| 2011/0272625 | A1 | 11/2011 | Wijekoon et al. |
| 2011/0287577 | A1 | 11/2011 | Stewart et al. |

FOREIGN PATENT DOCUMENTS

| | | |
|---|---|---|
| JP | 05308148 A | 11/1993 |
| JP | H10-70296 A | 3/1998 |
| JP | 11-274538 A | 10/1999 |
| JP | 11274538 A | 10/1999 |
| JP | 2003-197932 A | 7/2003 |
| JP | 2003209169 A | 7/2003 |
| JP | 2005-011886 A | 1/2005 |
| JP | 2007220707 A | 8/2007 |
| JP | 2008-139251 A | 6/2008 |
| KR | 1020020004313 | 1/2002 |
| KR | 10-2004-0042209 | 5/2004 |
| KR | 1020040042209 | 5/2004 |
| KR | 1020040104418 | 12/2004 |
| KR | 10-2008-0003623 | 1/2008 |
| KR | 1020080003623 | 1/2008 |
| WO | 2008098407 A1 | 8/2008 |
| WO | 2008140224 A2 | 11/2008 |
| WO | 2009032734 A1 | 3/2009 |
| WO | WO-2010068331 A1 | 6/2010 |

OTHER PUBLICATIONS

PCT International Search Report and Written Opinion dated Jan. 11, 2010 for International Application No. PCT/US2009/050808.

PCT International Search Report and Written Opinion dated Dec. 27, 2010 for International Application No. PCT/US2009/050811.

Zuwairie Ibrahim, et al. " Performance Evaluation of Wavelet-Based Algorithm for Printed Circuit Board (PCB) Inspection",Jurnal Teknologi, 35 (D) Dis. 2001:39-54.

Shenglin Lu et al. "An Integrated Inspection Method Based on Machine Vision for Solder Paste Depositing", 2007 IEEE International Conference on Control and Automation. China—May 30 to Jun. 1, 2007. p. 137-141.

Patrick Tong. "Using Visual Inspection in Your PCB Test Strategy", Electronics Engineer, Sep. 1998. 3 pages.

Office Action dated Nov. 5, 2013 for Japanese Patent Application No. 2011-540726 with attached English translation; 5 pages.

* cited by examiner

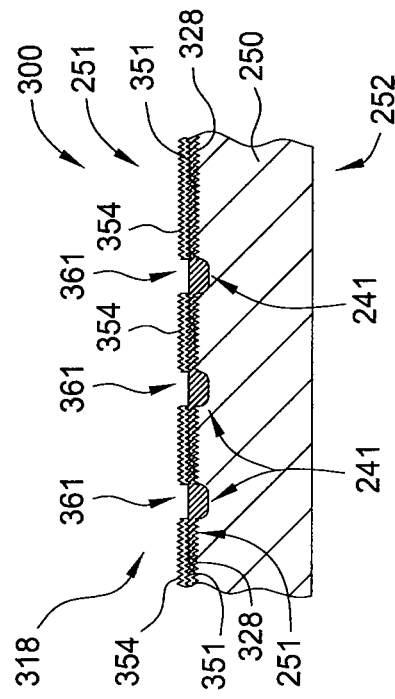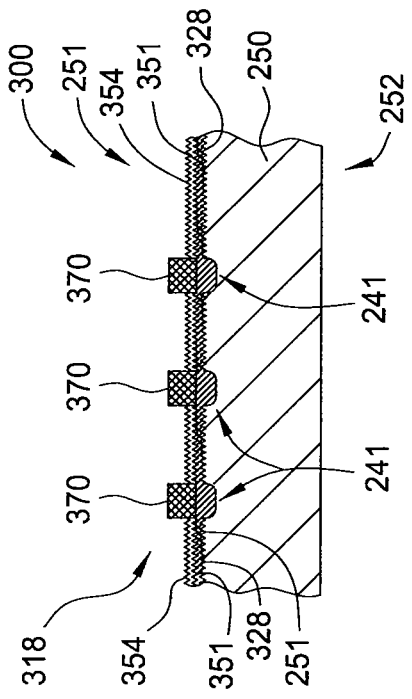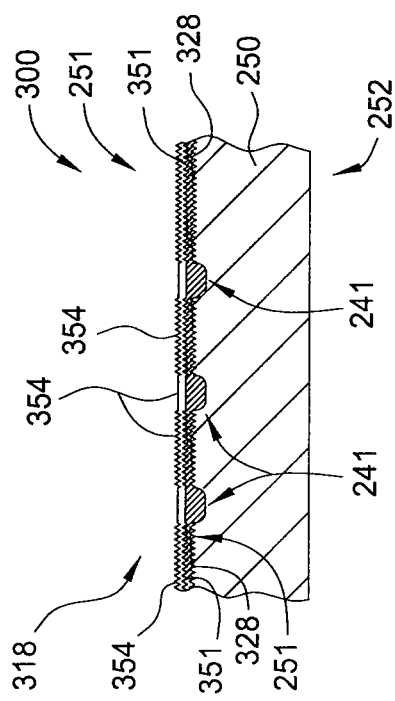

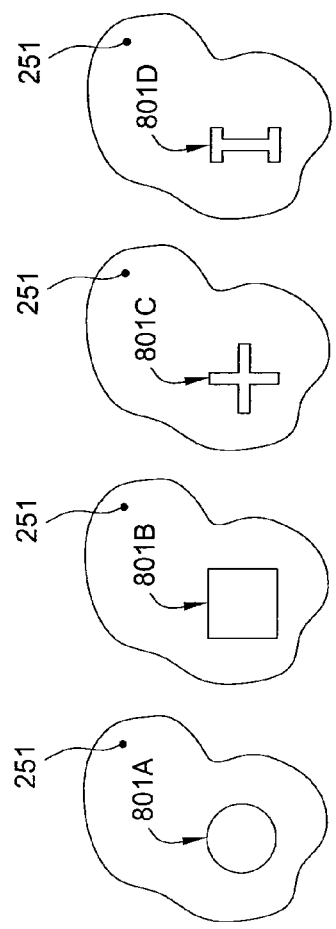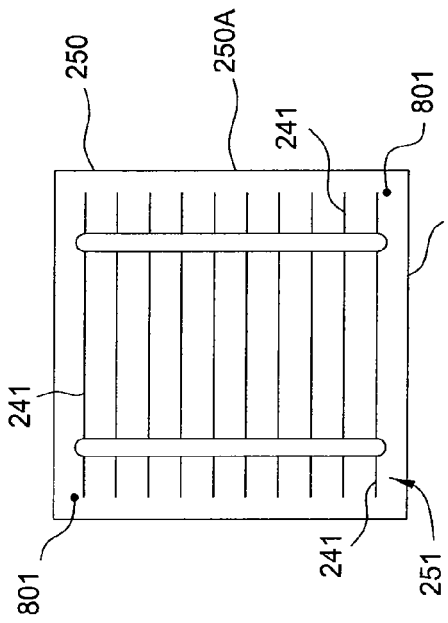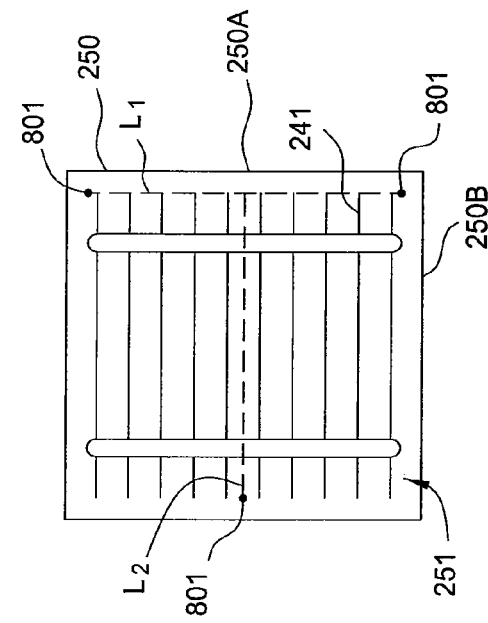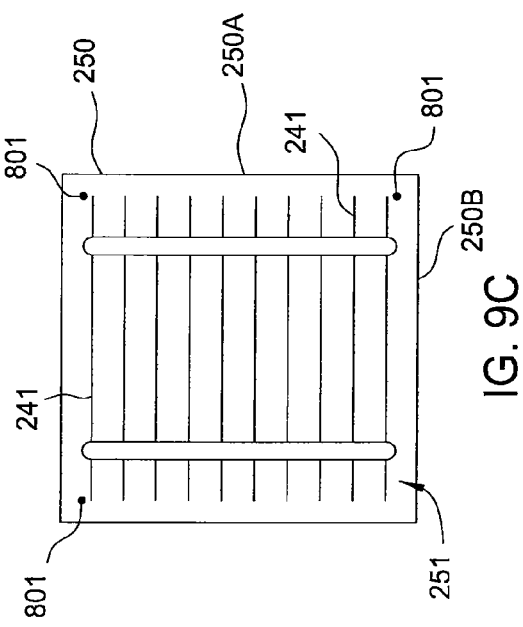
FIG. 9A
FIG. 9B
FIG. 9C
FIG. 9D

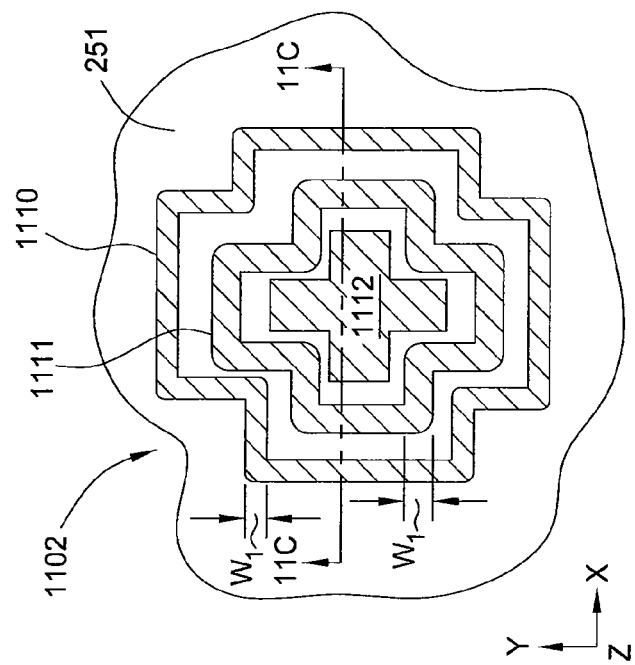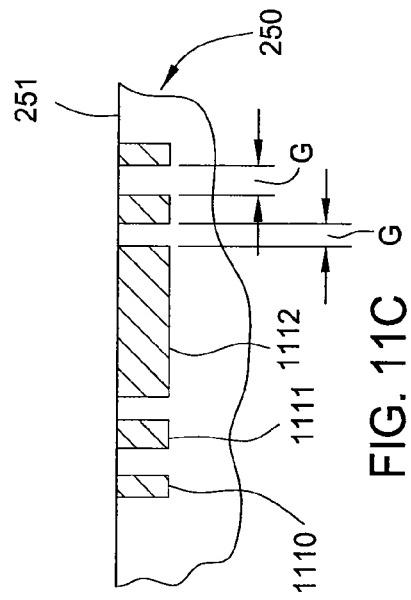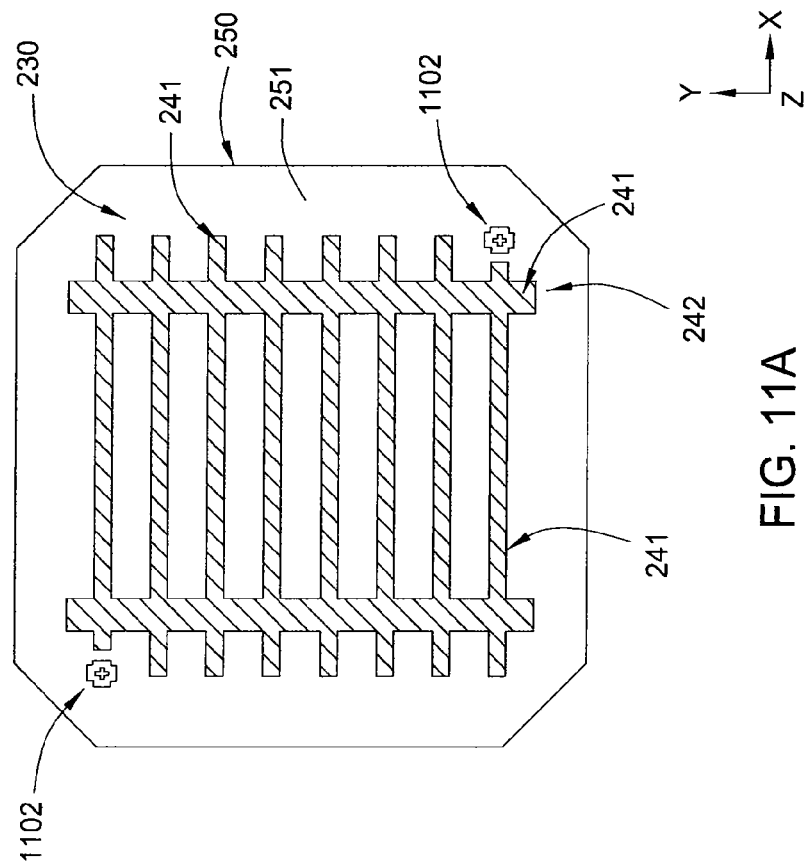

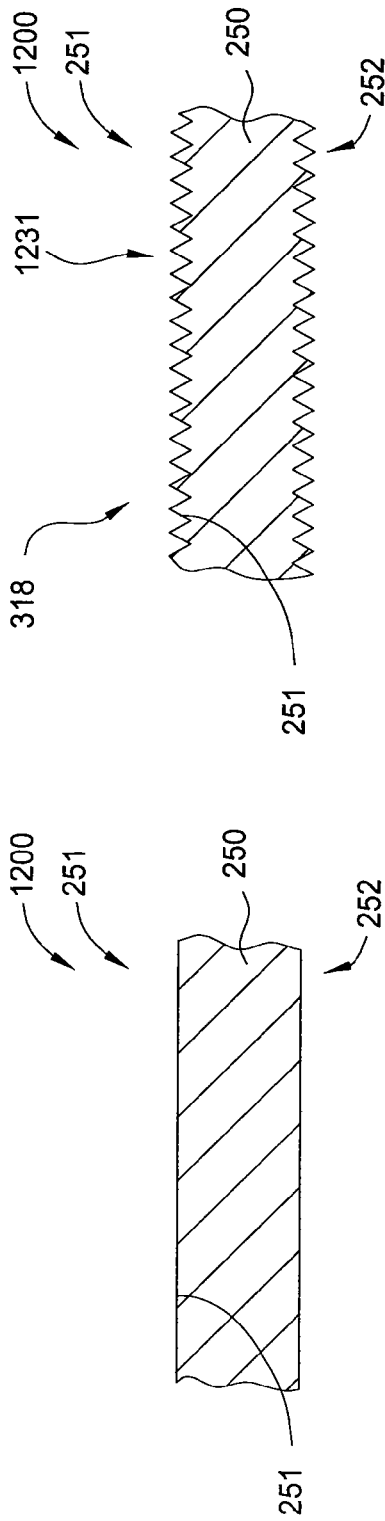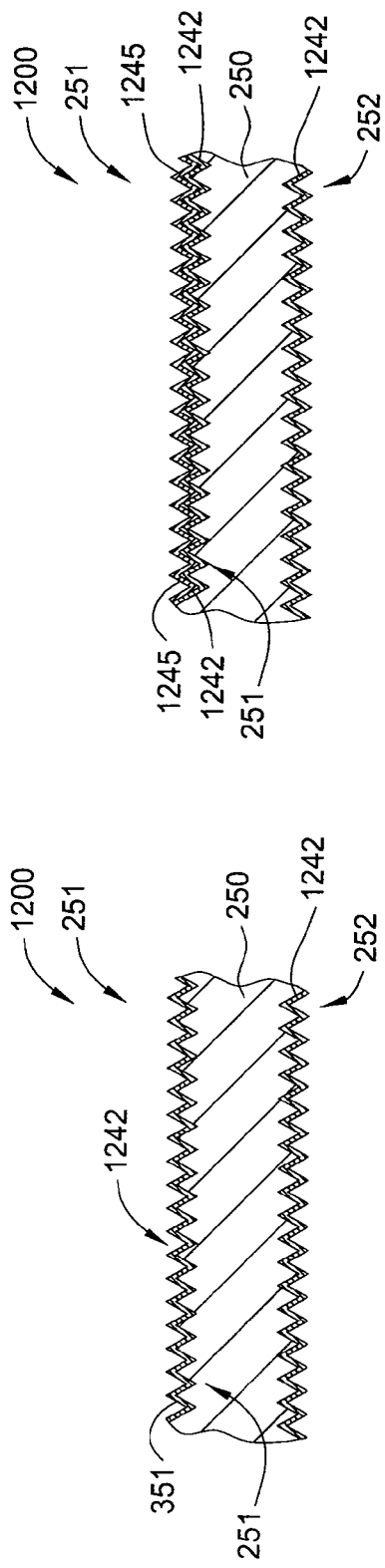

US 8,673,679 B2

ENHANCED VISION SYSTEM FOR SCREEN PRINTING PATTERN ALIGNMENT

BACKGROUND OF THE INVENTION

1. Field of the Invention

Embodiments of the present invention generally relate to a system and process for forming a patterned layer on desired regions of a surface of a substrate.

2. Description of the Related Art

Solar cells are photovoltaic (PV) devices that convert sunlight directly into electrical power. The PV market has experienced growth at annual rates exceeding 30% for the last ten years. Some articles suggest that solar cell power production world-wide may exceed 10 GWp in the near future. It is estimated that more than 95% of all solar modules are silicon wafer based. The high market growth rate in combination with the need to substantially reduce solar electricity costs has resulted in a number of serious challenges for inexpensively forming high quality solar cells. Therefore, one major component in making commercially viable solar cells lies in reducing the manufacturing costs required to form the solar cells by improving the device yield and increasing the substrate throughput.

Solar cells typically have one or more p-n junctions. Each p-n junction comprises two different regions within a semiconductor material where one side is denoted as the p-type region and the other as the n-type region. When the p-n junction of a solar cell is exposed to sunlight (consisting of energy from photons), the sunlight is directly converted to electricity through the PV effect. Solar cells generate a specific amount of electric power and are tiled into modules sized to deliver the desired amount of system power. Solar modules are joined into panels with specific frames and connectors. Solar cells are commonly formed on silicon substrates, which may be single or multicrystalline silicon substrates. A typical solar cell includes a silicon wafer, substrate, or sheet typically less than about 0.3 mm thick with a thin layer of n-type silicon on top of a p-type region formed on the substrate.

FIGS. 1A and 1B schematically depicts a standard silicon solar cell 10 fabricated on a wafer 11. The wafer 11 includes a p-type base region 21, an n-type emitter region 22, and a p-n junction region 23 disposed therebetween. An n-type region, or n-type semiconductor, is formed by doping the semiconductor with certain types of elements (e.g., phosphorus (P), arsenic (As), or antimony (Sb)) in order to increase the number of negative charge carriers, i.e., electrons. Similarly, a p-type region, or p-type semiconductor, is formed by the addition of trivalent atoms to the crystal lattice, resulting in a missing electron from one of the four covalent bonds normal for the silicon lattice. Thus the dopant atom can accept an electron from a neighboring atoms covalent bond to complete the fourth bond. The dopant atom accepts an electron, causing the loss of half of one bond from the neighboring atom and resulting in the formation of a "hole".

When light falls on the solar cell, energy from the incident photons generates electron-hole pairs on both sides of the p-n junction region 13. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the frontside 18, i.e. the light-receiving side, and the backside 19 of the solar cell 10. The top contact structure, as shown in FIG. 1A, is generally configured as widely-spaced thin metal lines, or fingers 14, that supply current to a larger bus bar 15. The back contact 25 is generally not constrained to be formed in multiple thin metal lines, since it does not prevent incident light from striking solar cell 10. Solar cell 10 is generally covered with a thin layer of dielectric material, such as $Si_3N_4$, to act as an anti-reflection coating 16, or ARC, to minimize light reflection from the top surface 22A of solar cell 10.

Screen printing has long been used in printing designs on objects, such as cloth or ceramics, and is used in the electronics industry for printing electrical component designs, such as electrical contacts or interconnects on the surface of a substrate. State of the art solar cell fabrication processes also use screen printing processes. In some applications, it is desirable to screen print contact lines, such as fingers 14, on the solar cell substrate. The fingers 14 are in contact with the substrate are adapted to form an Ohmic connection with one or more doped regions (e.g., n-type emitter region 22). An Ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts are critical for the performance of the solar cell and reliability of the circuits formed in the solar cell fabrication process. To enhance the contact with the solar cell device it is typical to position a finger 14 on a heavily doped region 17 formed within the substrate surface to enable the formation of an Ohmic contact. Since the formed heavily doped regions 17, due to their electrical properties, tend to block or minimize the amount light that can pass there through it is desirable to minimize their size, while also making these regions large enough to assure that the fingers 14 can be reliably aligned and formed thereon. The misalignment of the deposited fingers 14 to the underlying heavily doped regions 17 due to errors in the positioning of the substrate on an automated transferring device, defects in the edge of the substrate, unknown registration and alignment of the heavily doped region 17 on the substrate surface and/or shifting of the substrate on the automated transferring device can lead to poor device performance and low device efficiency. Heavily doped regions 17 may be formed on the substrate surface using a variety of patterning techniques to create areas of heavier and lighter doping, for example by performing phosphorus diffusion steps using a patterned diffusion barrier. A backside contact completes the electrical circuit required for solar cell to produce a current by forming an Ohmic contact with p-type base region of the substrate.

Therefore, there is a need for a screen printing apparatus for the production of solar cells, electronic circuits, or other useful devices that has an improved method of controlling the alignment of the deposited metal feature(s) (e.g., fingers 14) to a heavily doped region using a screen printing or other similar process.

SUMMARY OF THE INVENTION

In one embodiment of the present invention a solar cell formation process, comprising positioning a substrate on a substrate receiving surface, wherein the substrate has a first surface and a patterned doped region formed thereon, determining the actual position of the patterned doped region on the substrate, wherein determining the actual position comprises, emitting electromagnetic radiation towards the first surface, receiving electromagnetic radiation at a first wavelength from a region of the first surface, aligning one or more features in a screen printing mask to the patterned doped region using information received from the determined actual position of the patterned doped region on the substrate, and depositing a layer of material through the one or more features and onto at least a portion of patterned doped region.

Embodiments of the present invention may further provide a solar cell formation process, comprising disposing a first dopant material in a pattern on a first surface of a substrate, etching a portion of the first surface while the first dopant material is disposed on the first surface, heating the substrate and first dopant material to cause dopant atoms in the first dopant material to diffuse into the first surface and form a patterned doped region, capturing an optical image of a portion of the patterned doped region, aligning features in a screen printing mask to the patterned doped region using information received from the captured optical image, and depositing a layer of material through the features and onto at least a portion of the patterned doped region.

Embodiments of the present invention may further provide a solar cell formation process, comprising diffusing a first amount of a first dopant atom into a first surface of a substrate to form a first doped region, disposing a masking material in a pattern on the first surface over at least a portion of the first doped region, etching a portion of the first surface while the masking material is disposed on the first surface, diffusing a second amount of a second dopant atom into the first surface to form a second doped region after disposing the masking material on the first surface and etching the portion of the first surface, capturing an optical image of a portion of the first doped region and a portion of the second doped region, aligning features in a screen printing mask relative to at least a portion of the first doped region using information received from the captured optical image, and depositing a layer of material through the features and onto at least a portion of the first doped region.

Embodiments of the present invention may further provide a solar cell formation process, comprising etching a portion of a first surface of a substrate, depositing a first layer over a portion of the etched first surface, removing a portion of the deposited first layer disposed over the etched first surface to expose a region of the substrate, delivering a dopant containing material to the exposed region of the substrate to form a doped region within the substrate, capturing an image of a portion of the first surface of the substrate, wherein the image comprises a portion of the exposed region and a portion of the etched first surface, aligning features in a screen printing mask to the exposed region using information received from the captured image, and depositing a layer of material through the features and onto at least a portion of the patterned doped region after they are aligned to the exposed region.

Embodiments of the present invention may further provide an apparatus for processing a substrate, comprising a substrate supporting surface, an electromagnetic radiation source that is positioned to emit electromagnetic radiation towards the substrate supporting surface, a detector assembly that is positioned to receive at least a portion of the emitted electromagnetic radiation that is directed towards a surface of a substrate that is disposed on the substrate supporting surface, wherein the received electromagnetic radiation is provided at a wavelength that is preferentially transmitted through or reflected by a patterned heavily doped region formed on a surface of the substrate or preferentially transmitted through or reflected by regions of the substrate that do not comprise the patterned heavily doped region, a deposition chamber having a screen printing mask and at least one actuator which is configured to position the screen printing mask, and a controller configured to receive a signal from the detector assembly regarding the position of a patterned heavily doped region formed on a surface of a substrate that is disposed on the substrate supporting surface, and adjust the position of the screen printing mask relative to the patterned heavily doped region based on the information received from the detector assembly.

Embodiments of the present invention may further provide a solar cell formation process, comprising disposing a first dopant material on a first surface of a substrate to form a pattern, heating the substrate and first dopant material to cause dopant atoms in the first dopant material to diffuse into the first surface and form a patterned doped region, etching the surface area not covered by the patterned dopant material, and subsequently performing a lighter diffusion of the textured areas, and finally capturing an optical image of a portion of the smoother patterned and heavily doped region, aligning features in a screen printing mask to the patterned doped region using information received from the captured optical image, and depositing a layer of material through the features and onto at least a portion of the patterned doped region. In one configuration, the process of etching the surface area not covered by the patterned dopant material includes using a process optimized to provide texture that improves light absorption.

Embodiments of the present invention may further provide an apparatus for processing a substrate, comprising a substrate supporting surface, an electromagnetic radiation source that is positioned to emit electromagnetic radiation towards the substrate supporting surface, a detector assembly that is positioned to receive at least a portion of the emitted electromagnetic radiation that contacts a surface of a substrate that is disposed on the substrate supporting surface, wherein the received electromagnetic radiation is provided at a wavelength that is preferentially transmitted through or reflected by a patterned heavily doped region formed on a surface of the substrate or preferentially transmitted through or reflected by regions of the substrate that do not comprise the patterned heavily doped region, a deposition chamber having a screen printing mask and at least one actuator which is configured to position the screen printing mask, and a controller configured to receive a signal from the detector assembly regarding the position of a patterned heavily doped region formed on a surface of a substrate that is disposed on the substrate supporting surface, and adjust the position of the screen printing mask relative to the patterned heavily doped region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 5A-5G illustrate schematic cross-sectional views of a solar cell during different stages of a solar cell formation processing sequence according to one embodiment of the invention.

FIG. 9A illustrates various examples of alignment marks to be printed on a substrate according to one embodiment of the present invention.

FIGS. 9B-9D illustrate various configurations of alignment marks on a front surface of a substrate according to embodiments of the present invention.

FIG. 11A is plan view of a surface of a substrate that has a heavily doped region and alignment marks formed on a front surface of a substrate according to one embodiment of the invention.

FIG. 11B is a plan view that illustrates an example of an alignment mark formed on a substrate according to one embodiment of the present invention.

FIG. 11C is a schematic cross-sectional view of a surface of a substrate according to one embodiment of the invention.

FIGS. 12A-12H illustrate schematic cross-sectional views of a solar cell during different stages of a solar cell formation processing sequence according to one embodiment of the invention.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide an apparatus and method for processing substrates in a system that utilizes an improved patterned material deposition processing sequence that can improve the device yield performance and cost-of-ownership (CoO) of a substrate processing line. In one embodiment, the system is a screen printing system that is adapted to perform a screen printing process within a portion of a crystalline silicon solar cell production line in which a substrate is patterned with a desired material and is then processed in one or more subsequent processing chambers. The subsequent processing chambers may be adapted to perform one or more bake steps and one or more cleaning steps. In one embodiment, the system is a module positioned within the Softline™ tool available from Baccini S.p.A., which is owned by Applied Materials, Inc. of Santa Clara, Calif. While the discussion below primarily discusses the processes of screen printing a pattern, such as an interconnect or contact structure, on a surface of a solar cell device this configuration is not intended to be limiting as to the scope of the invention described herein. Other substrate materials that may benefit from the invention include substrates that may have an active region that contain single crystal silicon, multi-crystalline silicon, polycrystalline silicon, or other desirable substrate materials.

Enhanced Optical Inspection System

Figure 1A:
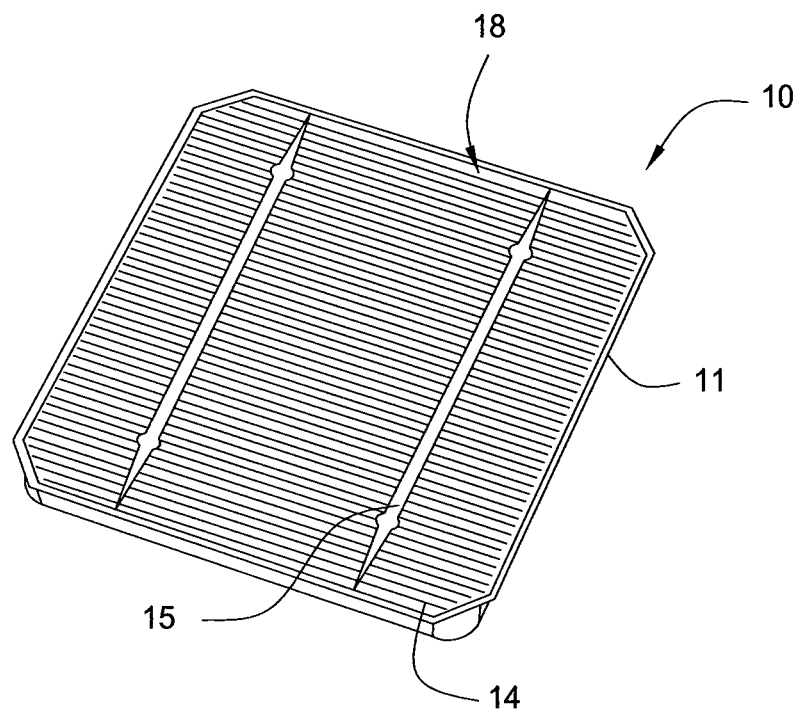
FIG. 1A illustrates an isometric view of prior art solar cell containing a front side metallization interconnect pattern.
Figure 1B:
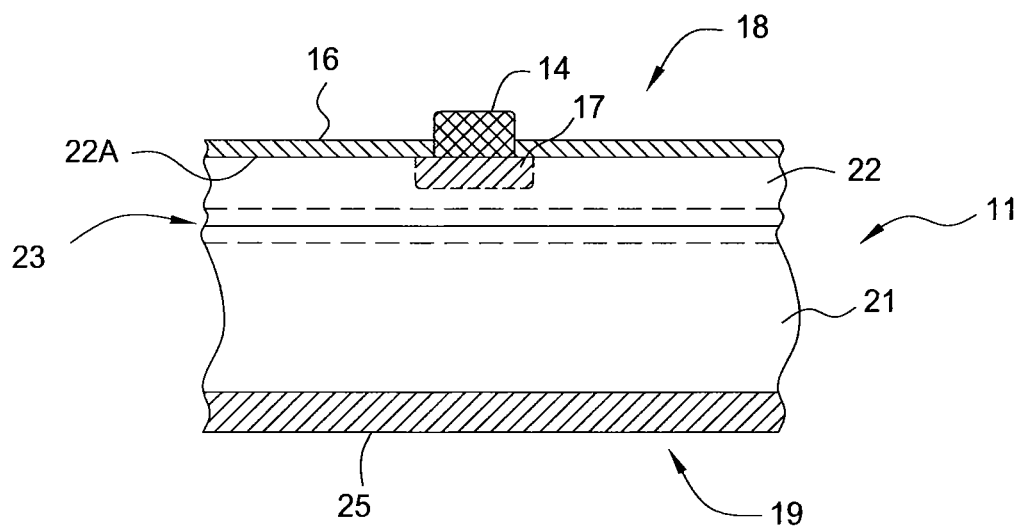
FIG. 1B illustrates a cross-sectional side view of a prior art solar cell shown in FIG. 1A.
Figure 2B:
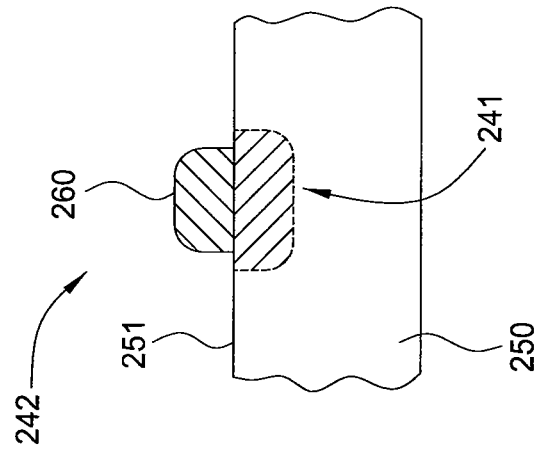
FIG. 2B is a close-up side cross-sectional view of a portion of the surface of the substrate shown in FIG. 2A according to one embodiment of the invention.
Figure 2A:
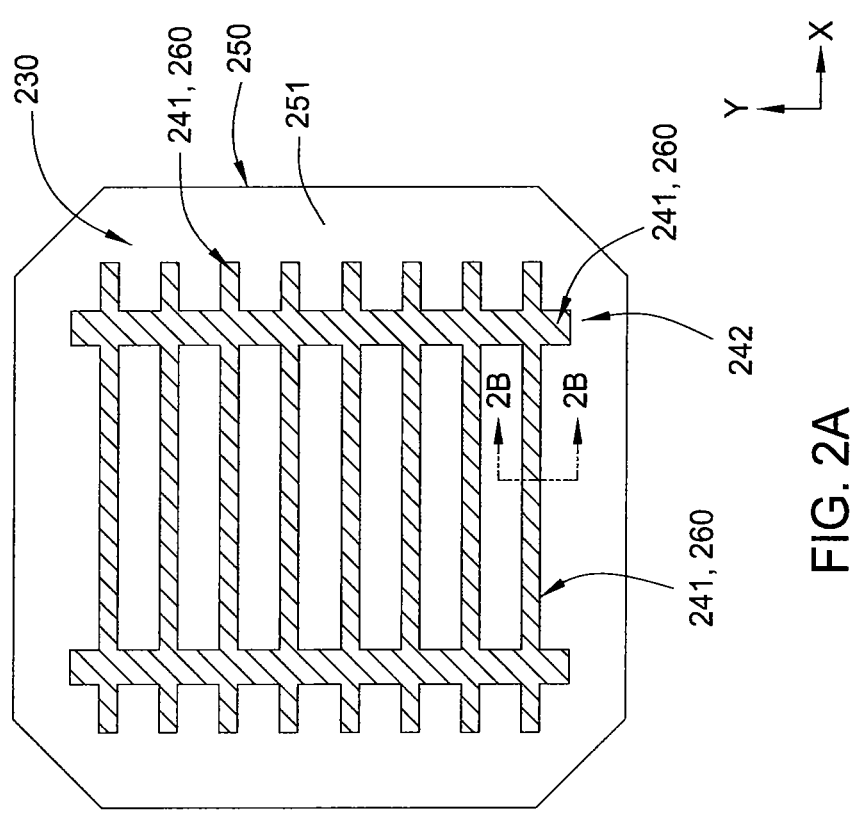
FIG. 2A is plan view of a surface of a substrate that has a heavily doped region and a patterned metal contact structure formed thereon according to one embodiment of the invention.

Embodiments of the invention also generally provide a novel solar cell formation process that includes the formation of metal contacts over heavily doped regions 241 that are formed in a desired pattern 230 on a surface of a substrate. Embodiments of the invention also provide an inspection system and supporting hardware that is used to reliably position a similarly shaped, or patterned, metal contact structure on the patterned heavily doped regions to allow an Ohmic contact to be made. FIG. 2A is plan view of a surface 251 of a substrate 250 that has a heavily doped region 241 and a patterned metal contact structure 242 formed thereon, such as the fingers 260. FIG. 2B is side cross-sectional view created at the cross-section line 2B-2B shown in FIG. 2A, and illustrates a portion of the surface 251 having a metal finger 260 disposed on the heavily doped region 241. As discussed above, the metal contact structure, such as fingers 260 and busbars 261, are formed on the heavily doped regions 241 so that a high quality electrical connection can be formed between these two regions. Low-resistance, stable contacts are critical for the performance of the solar cell. The heavily doped regions 241 generally comprise portions of a substrate 250 that has a sheet resistance of less than about 50 Ohms per square ($\Omega/\square$). In one embodiment, the heavily doped region 241 is formed in a silicon substrate and has a doping level greater than about $10^{18}$ atoms/cm$^3$. A patterned type of heavily doped regions 241 can be formed by conventional lithographic and ion implantation techniques, or conventional dielectric masking and high temperature furnace diffusion techniques that are well known in the art. However, the processes of aligning and depositing the metal contact structure 242 on the heavily doped regions 241 is difficult using conventional techniques, since there is typically no way to easily detect the actual alignment and orientation of the formed heavily doped region 241 pattern on the surface 251 of the substrate 250 using these techniques. It is believed that the ability to detect the actual alignment and orientation of the formed heavily doped region 241 pattern is particularly difficult after both heavily and lightly doped regions formed in the substrate 250 are covered with an antireflective coating layer.

Embodiments of the invention thus provide methods of first detecting the actual alignment and orientation of the patterned heavily doped regions 241 and then forming patterned metal contacts on the surface of the heavily doped regions 241 using the collected information. FIG. 4A illustrates one embodiment of an optical inspection system 400 that is configured to determine the actual alignment and orientation of the pattern 230 of the heavily doped region(s) 241 formed on a surface of a substrate 250. The optical inspection system 400 generally contains one or more electromagnetic radiation sources, such as radiation sources 402 and 403 that are configured to emit radiation at a desired wavelength and a detector assembly 401 this configured to capture the reflected or un-absorbed radiation so that the alignment and orientation of the heavily doped regions 241 can be optically determined relative to the other non-heavily doped regions of the substrate 250. The orientation and alignment data collected by the detector assembly 401 is then delivered to a system controller 101 that is configured to adjust and control the placement of the metal contact structure, such as fingers 260, on the surfaced of the heavily doped regions 241 by use of patterned metallization technique. Patterned metallization techniques may include screen printing processes, ink jet printing processes, lithographic and blanket metal deposition process, or other similar patterned metallization processes. In one embodiment, the metal contacts are disposed on the surface of the substrate 250 using a screen printing process performed in a screen printing system 100, as discussed below in conjunction with FIGS. 3A-3D.

In configurations where the heavily doped regions 241 are formed within a silicon substrate it is believed that electromagnetic radiation emitted at wavelengths within the ultraviolet (UV) and infrared (IR) wavelength regions will either be preferentially absorbed, reflected or transmitted by the silicon substrate or heavily doped regions. The difference in the transmission, absorption or reflection of the emitted radiation can thus be used to create some discernable contrast that can be resolved by the detector assembly 401 and system controller 101. In one embodiment, it is desirable to emit electromagnetic radiation at wavelengths between about 850 nm and 4 microns ($\mu$m). In one embodiment, one or more of the radiation sources 402 and 403 are light emitting diodes (LEDs) that are adapted to deliver on or more of the desired wavelengths of light.

In one embodiment, of the optical inspection system 400 has a radiation source 402 that is configured to deliver electromagnetic radiation "$B_1$" to a surface 252 of a substrate 250 that is opposite to the side of the substrate on which the detector assembly 401 is disposed. In one example, the radiation source 402 is disposed adjacent to the backside of a solar cell substrate 250 and the detector assembly 401 is disposed adjacent to the front surface of the substrate 250. In this configuration, it is desirable to use optical radiation greater than the absorption edge of silicon, such as greater than about 1060 nm to allow that emitted electromagnetic radiation "$B_1$" to pass through the substrate 250 and be delivered to the detector assembly 401 following path "C". It is believed that due to the high doping level (e.g., $>10^{18}$ atoms/cm$^3$) in the heavily doped regions versus the typically lightly doped silicon substrate (e.g., $<10^{17}$ atoms/cm$^3$), typically used in solar cell applications, the absorption or transmissive properties will be significantly different for each of these regions within these wavelengths. In one embodiment, it is desirable to confine the emitted wavelengths in a range between about 1.1 $\mu$m and about 1.5 $\mu$m. In one example, the heavily doped regions have a sheet resistance of at least 50 Ohms per square.

In another embodiment of the optical inspection system 400, a radiation source 403 is configured to deliver electromagnetic radiation "$B_2$" to a surface 251 of a substrate 250 that is on the same side of the substrate as the detector assembly 401 so that one or more of the emitted wavelengths will be absorbed or reflected by portions of the substrate 250 or the heavily doped regions 241 and delivered to the camera following path "C". In this configuration, it is desirable to emit optical radiation at wavelengths between about 300 nm and 4 microns ($\mu$m) until a desired contrast between the regions can be detected by the detector assembly 401. In one example, it is desirable to emit optical radiation at wavelengths between about 850 nm and 4 microns ($\mu$m). In another example, it is desirable to use a radiation source 403 that emits shorter wavelengths of light, such as the wavelengths in the blue to near UV range (e.g., 300-450 nm), since it is believed that this range will provide an improved optical contrast when using a reflection type mode optical detection technique.

In one embodiment of the optical inspection system 400, two radiation sources 402 and 403 and one or more detector assemblies 401 are used to help further detect the pattern of the heavily doped regions 241 on the surface of the substrate 250. In this case, it may be desirable to configure the radiation sources 402 and 403 so that they emit radiation at the same or different wavelengths.

The detector assembly 401 includes an electromagnetic radiation detector, camera or other similar device that is configured to measure the intensity of the received electromagnetic radiation at one or more wavelengths. In one embodiment, the detector assembly 401 includes a camera 401A that is configured to detect and resolve features on a surface of a substrate within a desired wavelength range emitted by one or more of the radiation sources 402 or 403. In one embodiment, the camera 401A is an InGaAs type camera that has a cooled CCD array to enhance the signal-to-noise ratio of the detect signal. In some configurations, it is desirable to isolate the detector assembly 401 from ambient light by enclosing or shielding the areas between the surface 251 of the substrate 250 and the camera 401A.

In one embodiment, the detector assembly 401 also includes one or more optical filters (not shown) that are disposed between the camera 401A and the surface of the substrate 251. In this configuration, the optical filter(s) are selected to allow only certain desired wavelengths to pass to the camera 401A to reduce the amount of unwanted energy being received by the camera 401A to improve the signal-to-noise ratio of the detected radiation. The optical filter(s) can be a bandpass filter, a narrowband filter, an optical edge filters, a notch filter, or a wideband filter purchased from, for example, Barr Associates, Inc. or Andover Corporation. In another aspect of the invention, an optical filter is added between the radiation sources 402 or 403 and the substrate 250 to limit the wavelengths projected onto the substrate and detected by the camera 401A. In this configuration, it may be desirable to select radiation sources 402 or 403 that can deliver a broad range of wavelengths and use filters to limit the wavelengths that strike the surface of the substrate.

Figure 3A:
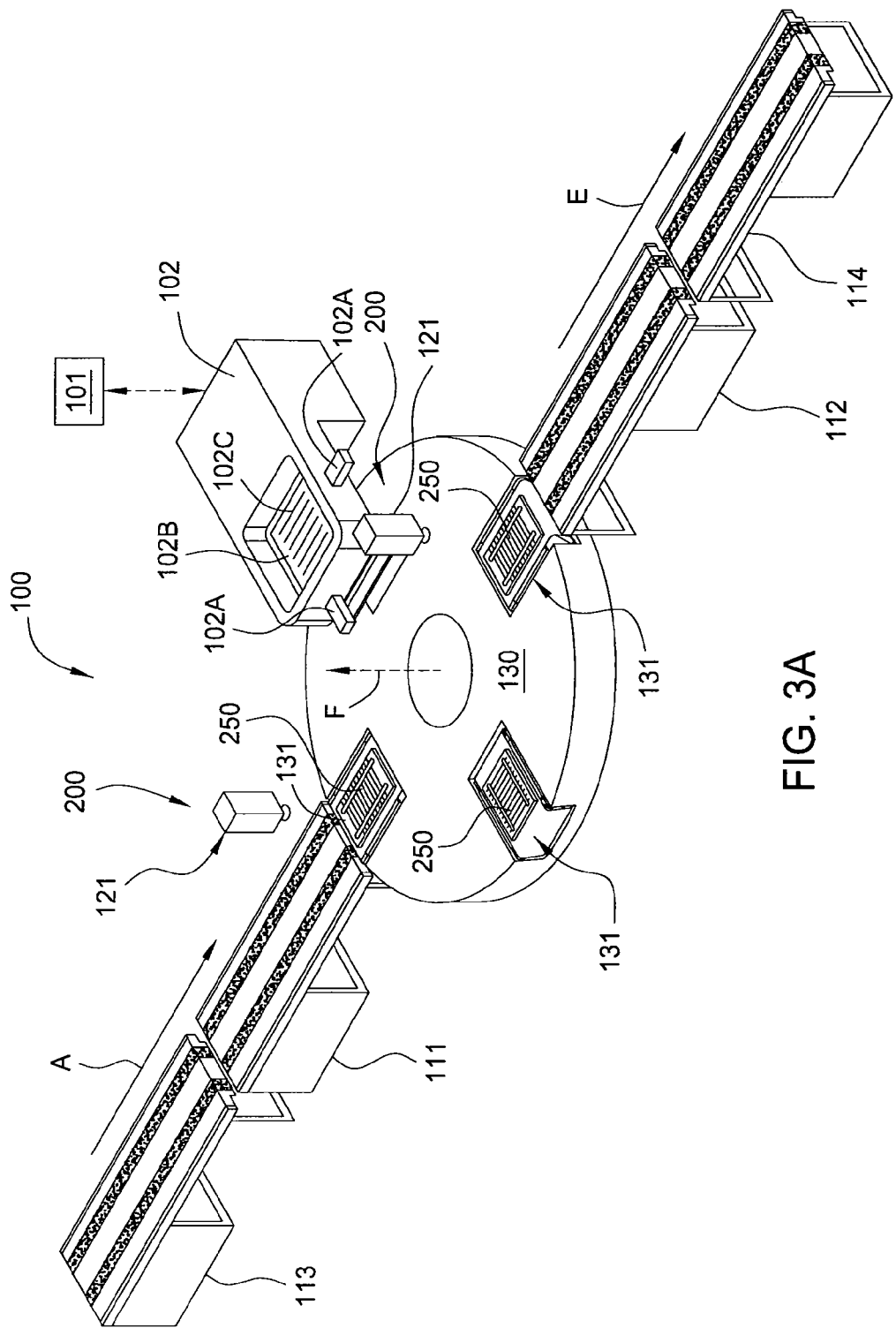
FIG. 3A is a schematic isometric view of a system that may be used in conjunction with embodiments of the present invention to form multiple layers of a desired pattern.
Figure 3B:
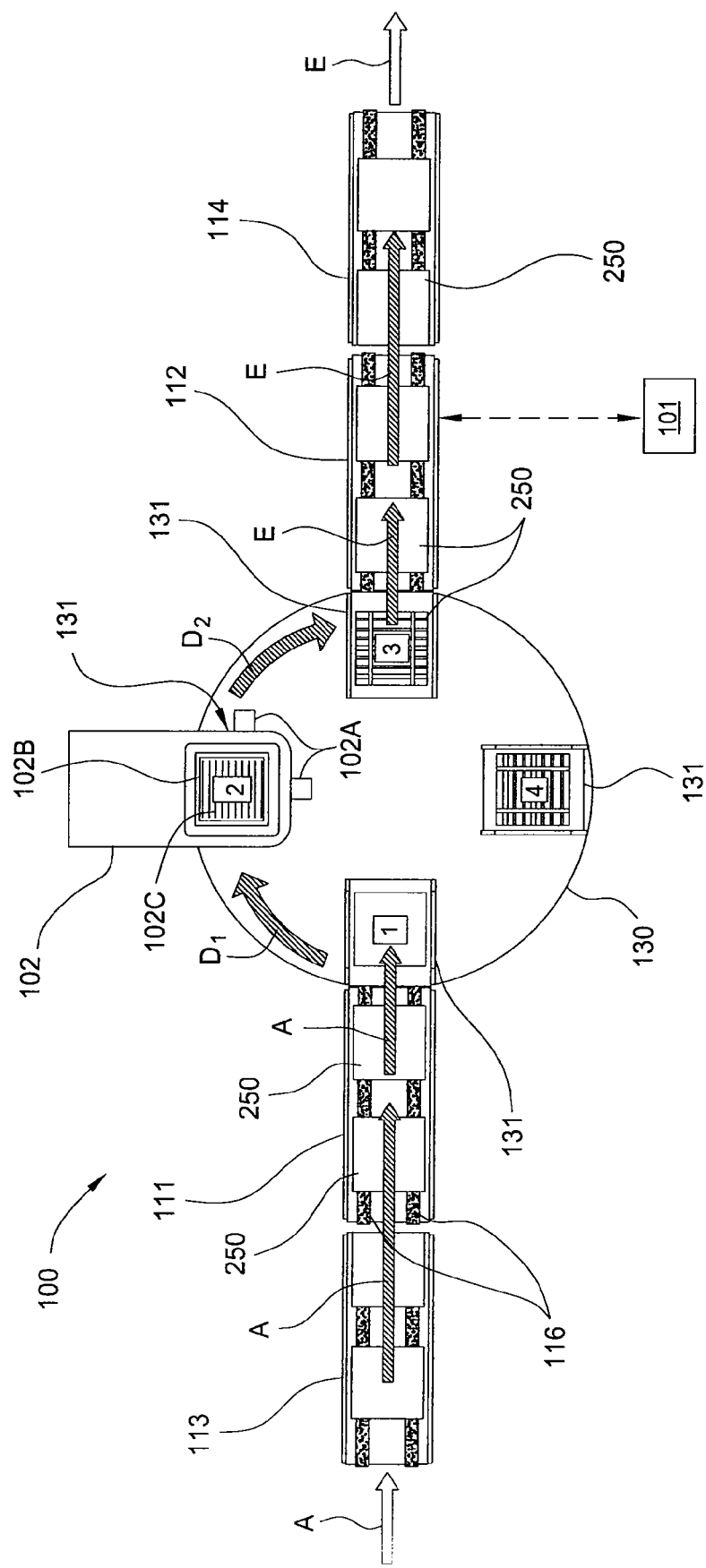
FIG. 3B is a schematic top plan view of the system in FIG. 3A according to one embodiment of the invention.
Figure 4A:
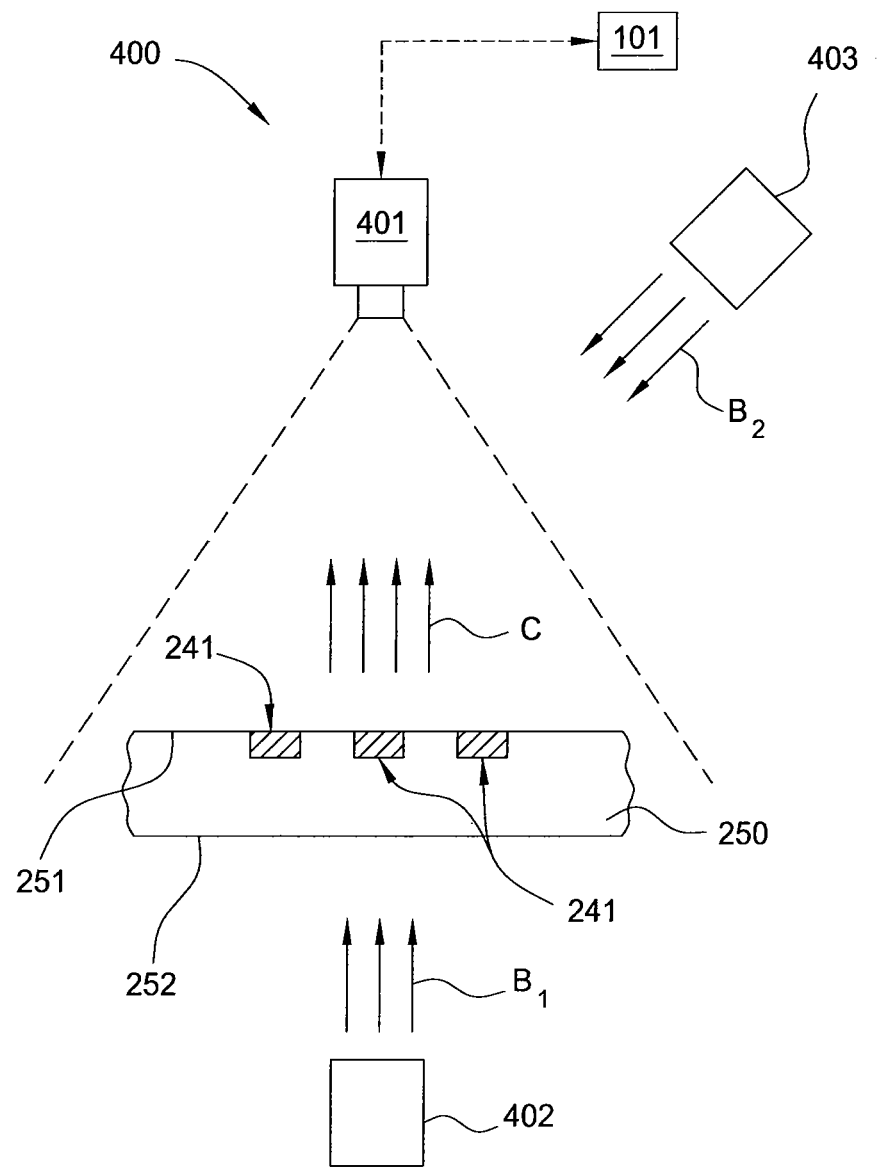
FIG. 4A is a schematic cross-sectional view of a optical inspection system according to one embodiment of the invention.

FIG. 3A is a schematic isometric view and FIG. 3B is a schematic top plan view illustrating one embodiment of a screen printing system, or system 100, that may be used in conjunction with embodiments of the present invention to form the metal contacts in a desired pattern on a surface of a solar cell substrate 250 using the optical inspection system 400. In one embodiment, the system 100 comprises an incoming conveyor 111, a rotary actuator assembly 130, a screen print chamber 102, and an outgoing conveyor 112. The incoming conveyor 111 may be configured to receive a substrate 250 from an input device, such as an input conveyor 113 (i.e., path "A" in FIG. 3B), and transfer the substrate 250 to a printing nest 131 coupled to the rotary actuator assembly 130. The outgoing conveyor 112 may be configured to receive a processed substrate 250 from a printing nest 131 coupled to the rotary actuator assembly 130 and transfer the substrate 250 to a substrate removal device, such as an exit conveyor 114 (i.e., path "E" in FIG. 3B). The input conveyor 113 and the exit conveyor 114 may be automated substrate handling devices that are part of a larger production line. For example, the input conveyor 113 and the exit conveyor 114 may be part of the Softline™ tool, of which the system 100 may be a module.

The rotary actuator assembly 130 may be rotated and angularly positioned about the "F" axis by a rotary actuator (not shown) and a system controller 101, such that the printing nests 131 may be selectively angularly positioned within the system 100 (e.g., paths "$D_1$" and "$D_2$" in FIG. 3B). The rotary actuator assembly 130 may also have one or more supporting components to facilitate the control of the print nests 131 or other automated devices used to perform a substrate processing sequence in the system 100.

In one embodiment, the rotary actuator assembly 130 includes four printing nests 131, or substrate supports, that are each adapted to support a substrate 250 during the screen printing process performed within the screen print chamber 102. FIG. 3B schematically illustrates the position of the rotary actuator assembly 130 in which one printing nest 131 is in position "1" to receive a substrate 250 from the incoming conveyor 111, another printing nest 131 is in position "2" within the screen print chamber 102 so that another substrate 250 can receive a screen printed pattern on a surface thereof, another printing nest 131 is in position "3" for transferring a processed substrate 250 to the outgoing conveyor 112, and another printing nest 131 is in position "4", which is an intermediate stage between position "1" and position "3".

Figure 3C:
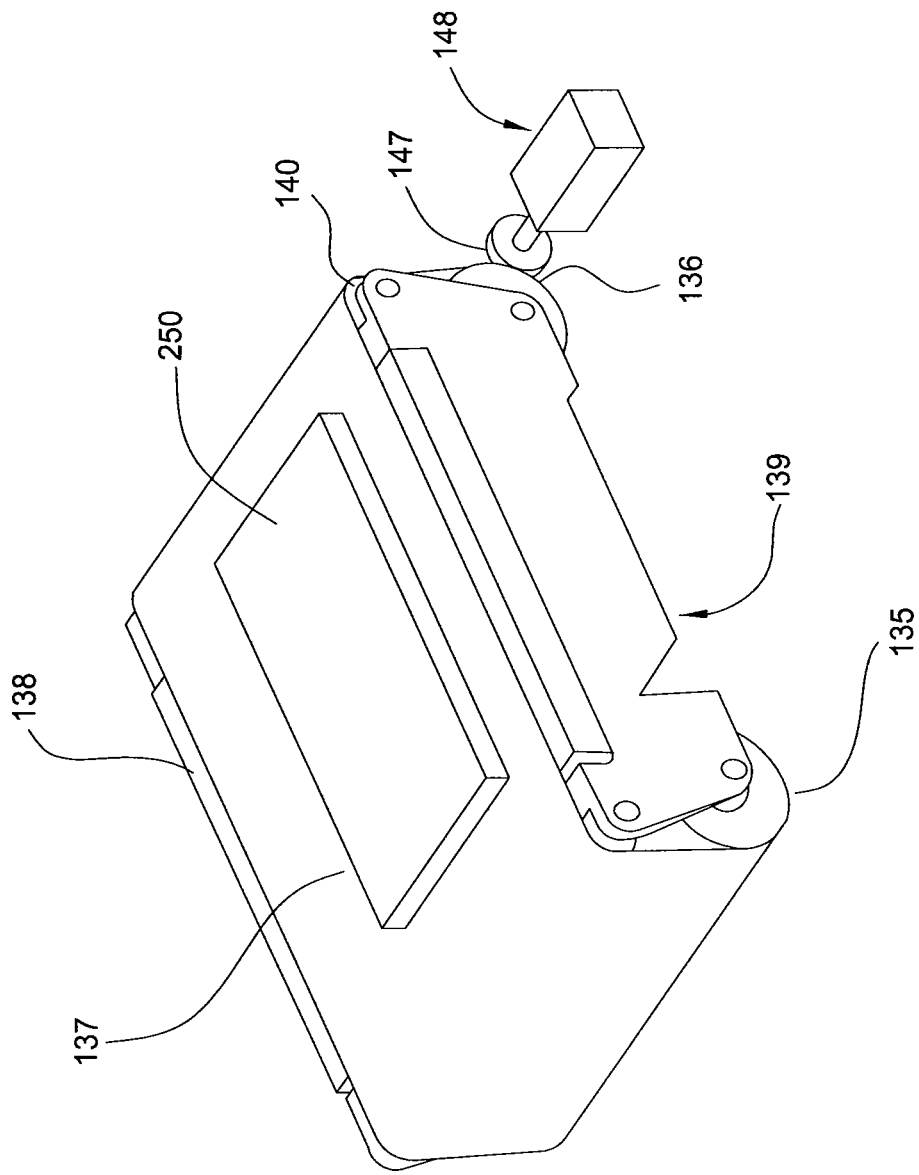
FIG. 3C is an isometric view of a printing nest portion of the screen printing system according to one embodiment of the invention.

As illustrated in FIG. 3C, a printing nest 131 generally consist of a conveyor assembly 139 that has a feed spool 135, a take-up spool 136, rollers 140 and one or more actuators 148, which are coupled to the feed spool 135 and/or take-up spool 136, that are adapted to feed and retain a supporting material 137 positioned across a platen 138. The platen 138 generally has a substrate supporting surface on which the substrate 250 and supporting material 137 are positioned during the screen printing process performed in the screen print chamber 102. In one embodiment, the supporting material 137 is a porous material that allows a substrate 250, which is disposed on one side of the supporting material 137, to be retained on the platen 138 by a vacuum applied to the opposing side of the supporting material 137 by a conventional vacuum generating device (e.g., vacuum pump, vacuum ejector). In one embodiment, a vacuum is applied to vacuum ports (not shown) formed in the substrate supporting surface 138A of the platen 138 so that the substrate can be "chucked" to the substrate supporting surface 138A of the platen. In one embodiment, the supporting material 137 is a transpirable material that consists, for instance, of a transpirable paper of the type used for cigarettes or another analogous material, such as a plastic or textile material that performs the same function. In one example, the supporting material 137 is a cigarette paper that does not contain benzene lines.

In one configuration, the actuators 148 are coupled to, or are adapted to engage with, the feed spool 135 and a take-up spool 136 so that the movement of a substrate 250 positioned on the supporting material 137 can be accurately controlled within the printing nest 131. In one embodiment, feed spool 135 and the take-up spool 136 are each adapted to receive opposing ends of a length of the supporting material 137. In one embodiment, the actuators 148 each contain one or more drive wheels 147 that are coupled to, or in contact with, the surface of the supporting material 137 positioned on the feed spool 135 and/or the take-up spool 136 to control the motion and position of the supporting material 137 across the platen 138.

In one embodiment, the system 100 includes an inspection assembly 200 adapted to inspect a substrate 250 located on the printing nest 131 in position "1". The inspection assembly 200 may include one or more cameras 121 positioned to inspect an incoming, or processed substrate 250, located on the printing nest 131 in position "1". In this configuration, the inspection assembly 200 includes at least one camera 121 (e.g., CCD camera) and other electronic components capable of inspecting and communicating the inspection results to the system controller 101 used to analyze the orientation and position of the substrate 250 on the printing nest 131. In another embodiment, the inspection assembly 200 comprises the optical inspection system 400, discussed above.

The screen print chamber 102 is adapted to deposit material in a desired pattern on the surface of the substrate 250 positioned on the printing nest 131 in position "2" during the screen printing process. In one embodiment, the screen print chamber 102 includes a plurality of actuators, for example, actuators 102A (e.g., stepper motors or servomotors) that are in communication with the system controller 101 and are used to adjust the position and/or angular orientation of a screen printing mask 102B (FIG. 3B) disposed within the screen print chamber 102 with respect to the substrate 250 being printed. In one embodiment, the screen printing mask 102B is a metal sheet or plate with a plurality of features 102C (FIG. 3B), such as holes, slots, or other apertures formed therethrough to define a pattern and placement of screen printed material (i.e., ink or paste) on a surface of a substrate 250. In general, the screen printed pattern that is to be deposited on the surface of a substrate 250 is aligned to the substrate 250 in an automated fashion by orienting the screen printing mask 102B in a desired position over the substrate surface using the actuators 102A and information received by the system controller 101 from the inspection assembly 200. In one embodiment, the screen print chamber 102 are adapted to deposit a metal containing or dielectric containing material on a solar cell substrate having a width between about 125 mm and 156 mm and a length between about 70 mm and 156 mm. In one embodiment, the screen print chamber 102 is adapted to deposit a metal containing paste on the surface of the substrate to form the metal contact structure on a surface of a substrate.

The system controller 101 facilitates the control and automation of the overall system 100 and may include a central processing unit (CPU) (not shown), memory (not shown), and support circuits (or I/O) (not shown). The CPU may be one of any form of computer processors that are used in industrial settings for controlling various chamber processes and hardware (e.g., conveyors, optical inspection assemblies, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to generate and store at least substrate positional information, the sequence of movement of the various controlled components, substrate optical inspection system information, and any combination thereof. In one embodiment of the present invention, the system controller 101 includes pattern recognition software to resolve the positions of the heavily doped regions 241 and/or alignment marks 801 as subsequently described with respect to FIGS. 4A-4B, 9A-9D and 10.

Figure 4B:
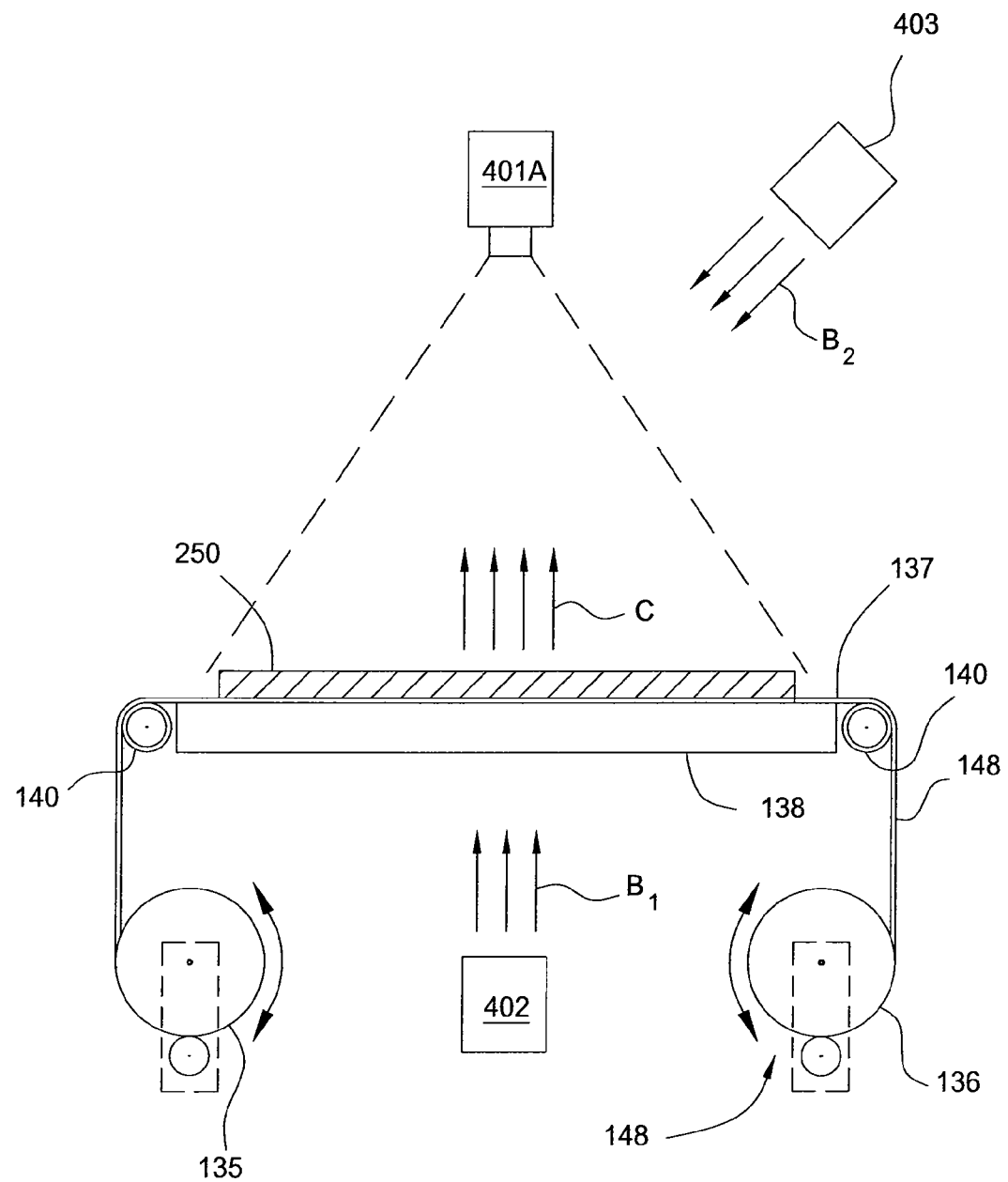
FIG. 4B is a schematic cross-sectional view of a optical inspection system positioned in a printing nest according to one embodiment of the invention.

In an effort to directly determine the alignment and orientation of the heavily doped regions 241 formed on the substrate surface 251 prior to forming a patterned conductive layer thereon, the system controller 101 may use of one or more optical inspection systems 400 to collect the desired data. FIG. 4B illustrates one embodiment of the optical inspection system 400 that is incorporated into part of the printing nest 131 and optical inspection assembly 200. In one embodiment, the inspection assembly 200 comprises a camera 401A, and the printing nest 131 that comprises a conveyor assembly 139, a supporting material 137, a platen 138, and a radiation source 402. In this configuration, the radiation source 402 is adapted to emit electromagnetic radiation "$B_1$" to a surface 252 of a substrate 250 through the supporting material 137 and platen 138 on which the substrate 250 is "chucked." The emitted electromagnetic radiation "$B_1$" then passes through portions of the substrate and follows path "C" to the camera 401A that is positioned to receive a portion of the emitted radiation. In general, the supporting material 137 and platen 138 are made from materials and have a thickness that will not significantly affect the signal-to-noise ratio of the electromagnetic radiation received and processed by the camera 401A and system controller 101. In one embodiment, the platen 138 is formed from an optically transparent material, such as sapphire, that will not significantly block the UV and IR wavelengths of light. As discussed above, in another embodiment, a radiation source 403 is configured to deliver electromagnetic radiation "$B_2$" to a surface 251 of a substrate 250 that is positioned on the supporting material 137 and the platen 138 so that one or more of the emitted wavelengths will be absorbed or reflected by portions of the substrate 250 and delivered to the camera 401A following path "C".

Figure 3D:
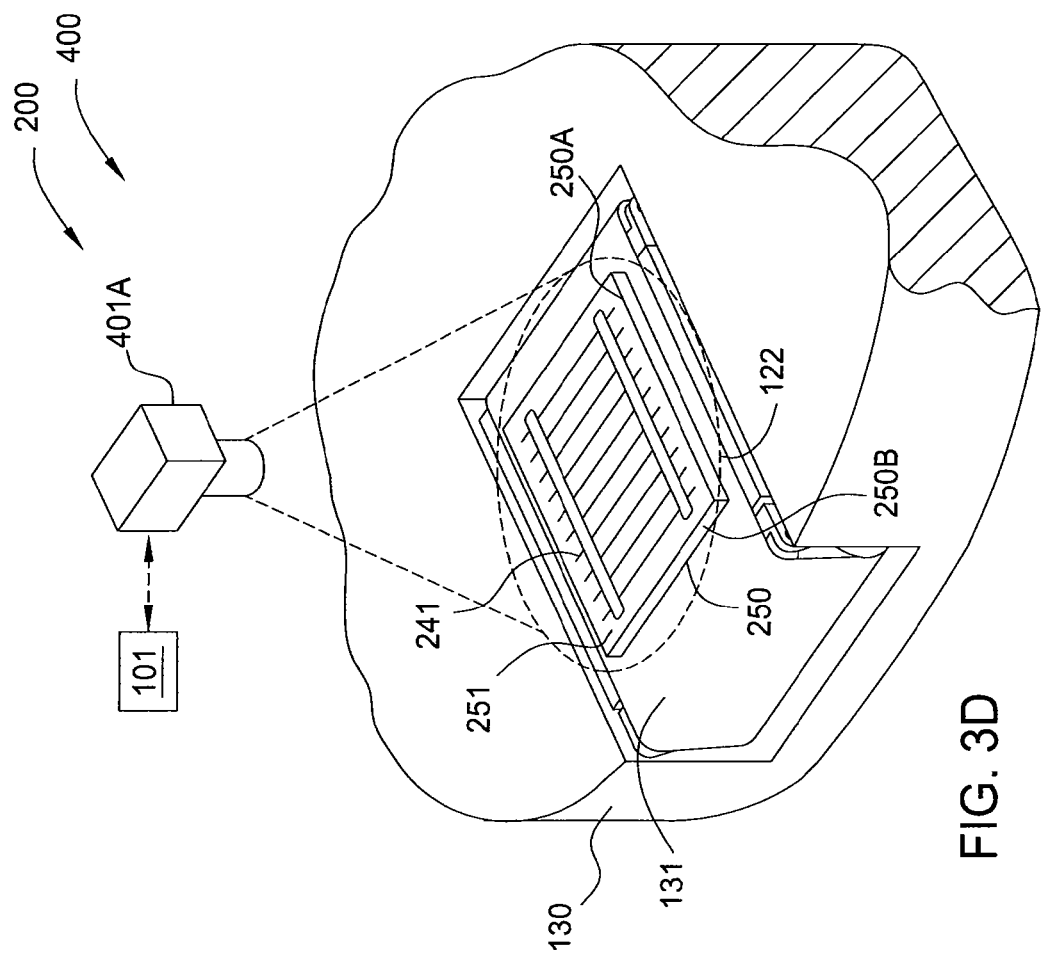
FIG. 3D is a schematic isometric view of one embodiment of a rotary actuator assembly having an inspection assembly is positioned to inspect the front surface of the substrate according to one embodiment of the invention.
Figure 10:
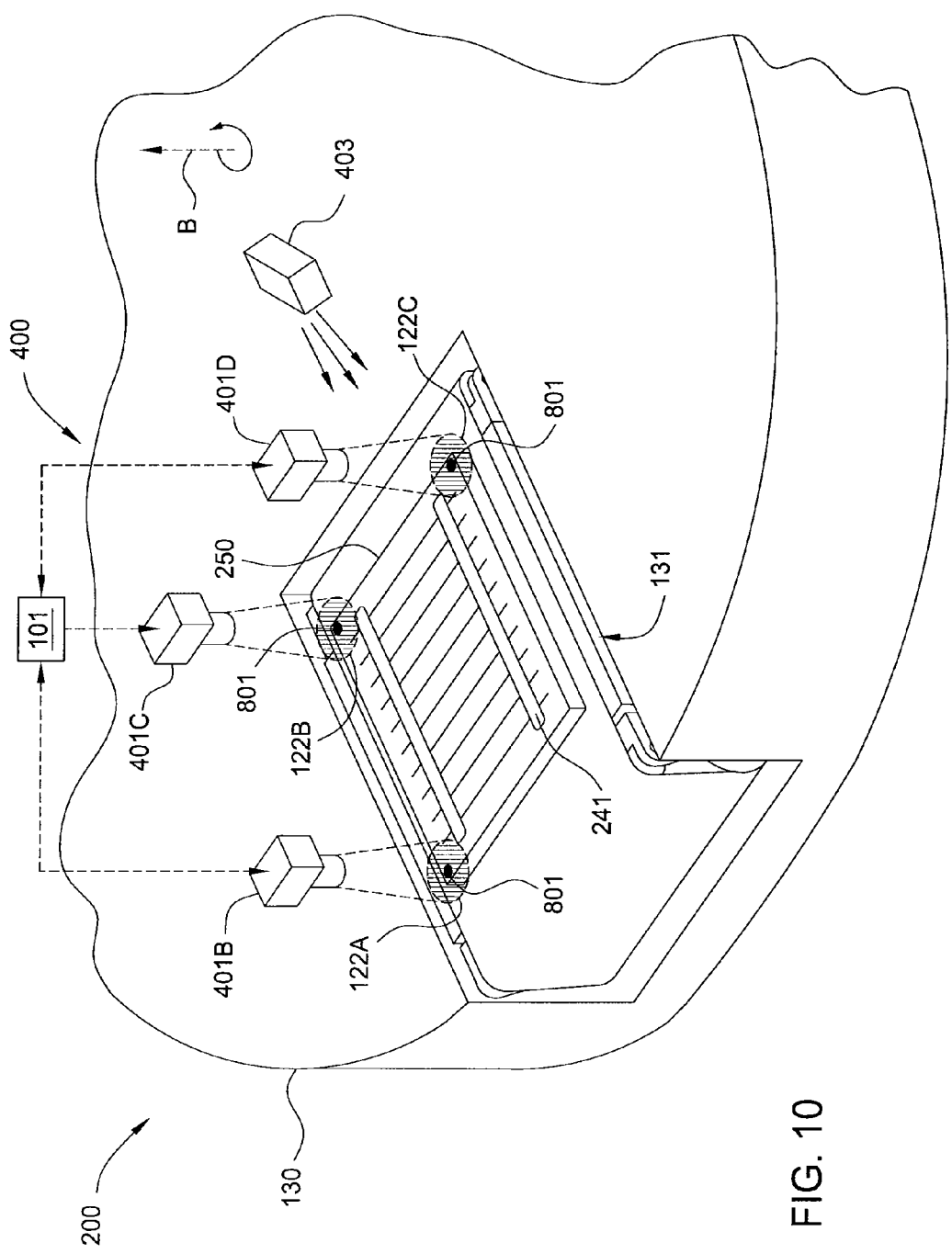
FIG. 10 is a schematic isometric view of one embodiment of the rotary actuator assembly in which the optical inspection assembly includes a plurality of optical inspection systems according to embodiments of the present invention.

FIG. 3D is a schematic isometric view of one embodiment of the rotary actuator assembly 130 that illustrates an inspection assembly 200 that is positioned to inspect a surface 251 of a substrate 250 disposed on a printing nest 131. In one embodiment, a camera 401A is positioned over the surface 251 of the substrate 250 so that a viewing area 122 of the camera 121 can inspect at least one region of the surface 251. The information received by the camera 401A is used to align the screen printing mask, and thus subsequently deposited material, to the heavily doped regions 241 by use of commands sent to the actuators 102A from the system controller 101. During normal process sequencing the heavily doped region 241 position information data is collected for each substrate 250 positioned on each printing nest 131 before it delivered to the screen print chamber 102. The inspection assembly 200 may also include a plurality of optical inspection systems 400 that are adapted to view different areas of a substrate 250 positioned on a printing nest 131 to help better resolve the pattern 230 formed on the substrate. FIG. 10 illustrates one configuration of the optical inspection systems 400 having a plurality of cameras 401B-401D that are positioned to view different positions of a formed pattern 230 on the surface 251 of the substrate 250. In one embodiment, each of the plurality of camera 401B-401D are positioned view different positions of the formed pattern 230 and/or one or more alignment marks 801 (FIG. 10) formed on the surface 251.

Solar Cell Formation Process

Embodiments of the invention also generally provide a novel solar cell formation process that includes an improved front side metallization process to create a higher performance solar cell device. Conventional front side metallization deposition processes include the formation of a metal contact structure (e.g., fingers and busbars) on heavily doped regions that are disposed within a textured front surface of the solar cell substrate. Typical texturing processes provide a surface having a roughness between about 1 micron (μm) and about 10 μm. The deposition of the metal containing materials used to form the fingers and busbars on the textured surface can greatly affect the electrical resistance of the formed fingers and busbars, due to the increased surface area that the deposited metal must cover versus an untextured surface. Similarly, the roughness of the textured surface will also greatly affect the spatial resolution of the formed heavily doped regions due to the increase in the surface area of these regions through which the dopant atoms will pass during the formation process versus an untextured surface. Also, as noted above, conventional inspection techniques are typically not able to optically determine the position of the heavily doped regions on a substrate surface. Therefore, there is also a need for an improved solar cell formation process that allows for a low resistance metal contact structure to be formed. It is also desirable to reliably position the fingers and busbars on the heavily doped regions to assure full Ohmic contact is created between the heavily doped regions 241 and the fingers and busbars. It is further desirable to create a solar cell formation process that allows the fingers and busbars to be formed on regions of the front surface that has not been textured.

General Solar Cell Formation Processing Steps

FIGS. 5A-5G illustrate schematic cross-sectional views of a solar cell substrate 250 during different stages of a processing sequence used to form a solar cell 300 device that has a metal contact structure formed on a surface 251. FIG. 6A illustrates a process sequence 600A used to form the active region(s) and/or metal contact structure on the solar cell 300. The sequence found in FIG. 6A corresponds to the stages depicted in FIGS. 5A-5G, which are discussed herein.

Figure 5A:
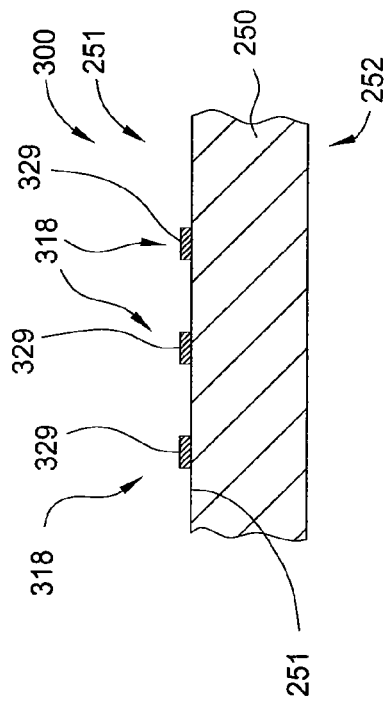
Figure 6A:
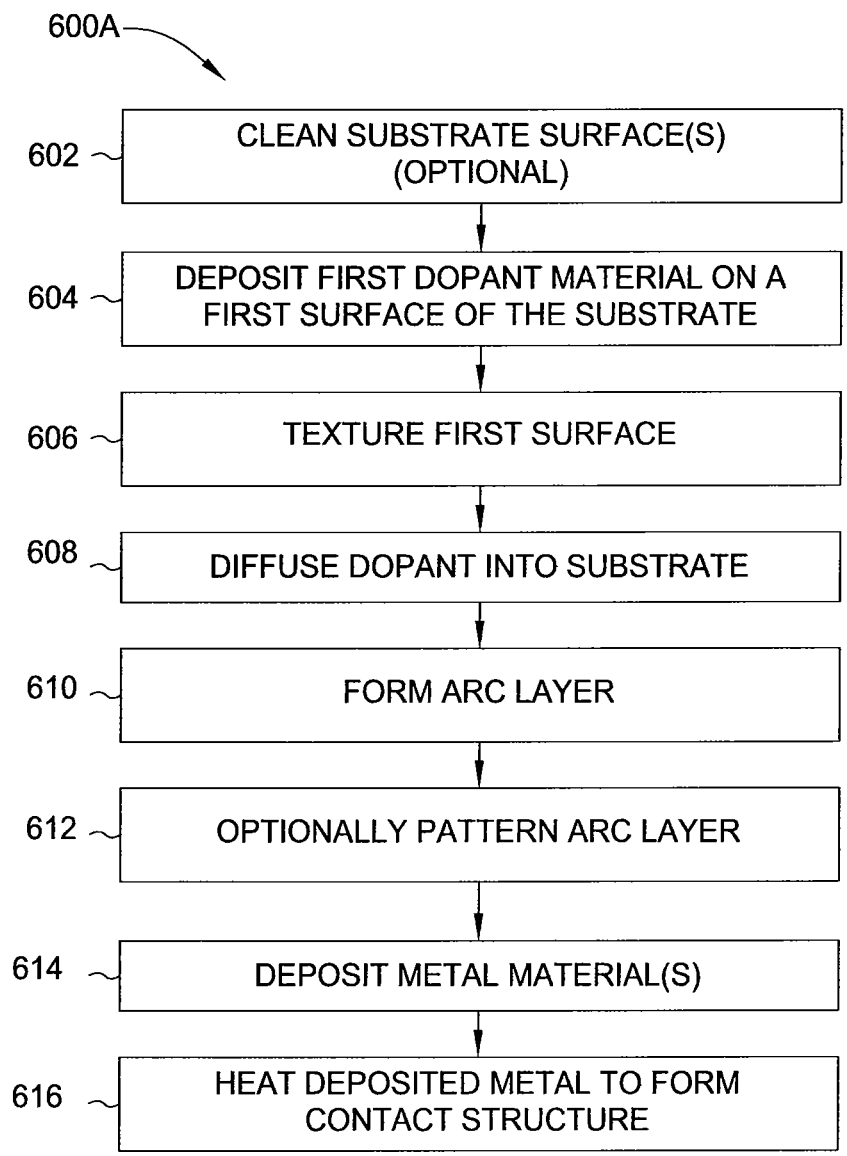
FIG. 6A illustrates a processing sequence used to form a solar cell according to embodiments of the invention.

At box 602, and as shown in FIGS. 5A and 6A, the surfaces of the substrate 250 are cleaned to remove any undesirable material or roughness. In one embodiment, the clean process may be performed using a batch cleaning process in which the substrates are exposed to a cleaning solution. The substrates can be cleaned using a wet cleaning process in which they are sprayed, flooded, or immersed in a cleaning solution. The clean solution may be a conventional SC1 cleaning solution, SC2 cleaning solution, HF-last type cleaning solution, ozonated water cleaning solution, hydrofluoric acid (HF) and hydrogen peroxide ($H_2O_2$) solution, or other suitable and cost effective cleaning solution. The cleaning process may be performed on the substrate between about 5 seconds and about 600 seconds, such as about 120 seconds. Another embodiment, the wet cleaning process may include a two step process in which a saw damage removal step is first performed on the substrate and then a second preclean step is performed. In one embodiment, the saw damage removal step includes exposing the substrate to an aqueous solution comprising potassium hydroxide (KOH) that is maintained at about 70° C. for a desired period of time.

Figure 5B:
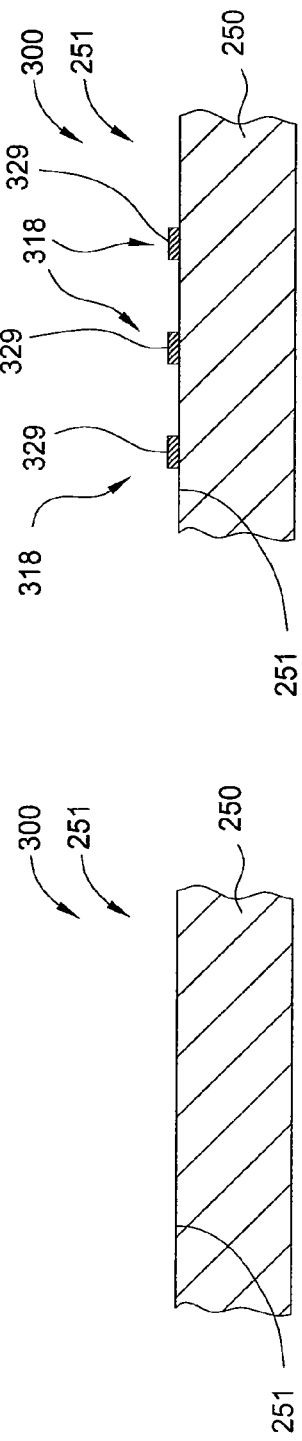

At box 604, as shown in FIGS. 5B and 6A, a first dopant material 329 is deposited onto one or more isolated regions 318 formed on the surface 251 of the substrate 250. In one embodiment, the first dopant material 329 is deposited or printed in a desired pattern 230 (FIG. 2A) by the use of screen printing, ink jet printing, rubber stamping or other similar process. In one embodiment, the first dopant material 329 is deposited using a screen printing process discussed in conjunction with FIGS. 3A-3D and 4A-4B. In one embodiment, the screen printing process performed by a Softline™ tool available from Baccini S.p.A a division of Applied Materials Inc. of Santa Clara, Calif. The first dopant material 329 may initially be a liquid, paste, or gel that is used to form the heavily doped regions 241 in the substrate 250 in a subsequent processing step. In general, the first dopant material 329 is formulated so that it can act as a mask during the subsequent texturization step(s) (box 606). In one embodiment, the first dopant material 329 is formulated to contain an organic and/or glass like material that is not attacked by the texturization process chemistry and is structurally capable of being a reliable masking material during one or more of the subsequent processing steps. In some cases, after disposing the first dopant material 329 on the surface 251 the substrate is heated to a desirable temperature to cause the first dopant material 329 to cure, densify, and/or form a bond with the surface 251. In one embodiment, the first dopant material 329 is a gel or paste that contains an n-type dopant that is disposed over a p-type doped substrate 110. Typical n-type dopants used in silicon solar cell manufacturing are elements, such as, phosphorus (P), arsenic (As), or antimony (Sb). In one example, the first dopant material 329 comprises a gel or paste having calcium phosphate or barium phosphate disposed in it. In one embodiment, the first dopant material 329 is phosphorous containing dopant paste that is deposited on the surface 251 and then heated to a temperature of between about 80 and about 500° C. In one embodiment, the first dopant material 329 may contain materials selected from a group consisting of phosphosilicate glass precursors, phosphoric acid ($H_3PO_4$), phosphorus acid ($H_3PO_3$), hypophosphorous acid ($H_3PO_2$), and/or various ammonium salts thereof. In one embodiment, the first dopant material 329 is a phosphosilicate gel or paste that contains between about 2 and about 30 atomic % of phosphorus to silicon. In another embodiment, the first dopant material 329 comprises a dopant containing glass frit, such as a phosphorous containing glass material, and binder material, which is configured to resist chemical attack from the texture etch chemistry. In another embodiment, the first dopant material 329 may comprise an organic binder material that has phosphorus doped amorphous silicon particles disposed therein. In some cases, the first dopant material 329 contains a hydrophobic binder material that is selected to resist attack from the wet texture etch chemistry. While the discussion above provides examples of the use of an n-type dopant used with a p-type substrate this configuration is not intended to limiting as to the scope of the invention described herein, since a p-type dopant (e.g., boron (B), aluminum (Al), gallium (Ga)) used with an n-type substrate is also contemplated.

Figure 5C:
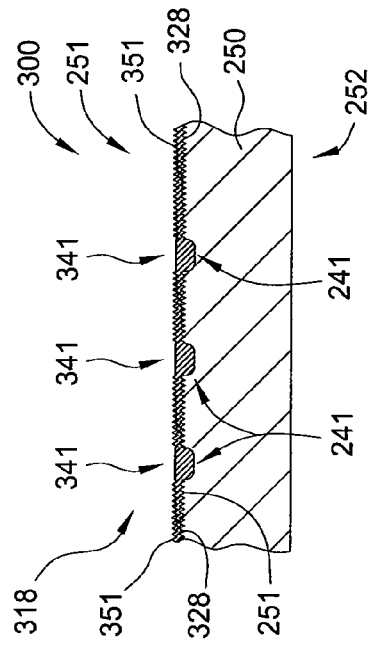

At box 606, as shown in FIGS. 5C and 6A, a texturizing process is performed on the surface 251 of the substrate 250 to form a textured surface 351. In one embodiment, the surface 251 is the front side of a solar cell substrate that is adapted to receive sunlight after the solar cell has been formed. In one example, the substrate is etched in an etching solution comprising between about 2.7% by volume of potassium hydroxide (KOH) and about 4500 ppm of 300 MW PEG that is maintained at a temperature of about 79-80° C. for about 30 minutes. An example of an exemplary texturization process is further described in the U.S. patent application Ser. No. 12/383,350, filed Mar. 23, 2009, which is herein incorporated by reference in its entirety.

Figure 5D:
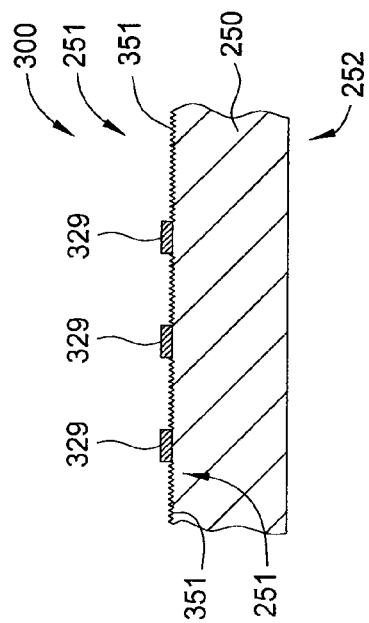

At box 608, as shown in FIGS. 5D and 6A, the substrate is heated to a temperature greater than about 800° C. to causes the doping elements in the first dopant material 329 to diffuse into the surface 251 to form the heavily doped regions 241. Therefore, since the first dopant material 329 is formulated to act as a mask for the texture chemistry, the heavily doped regions 241 will generally comprise relatively flat regions 341 that are untextured and easily discernable by optical inspection techniques and even the naked eye. In one embodiment, it is desirable to allow portions of the first dopant material 329 to vaporize during heating process to allow the vapors to lightly dope the other exposed regions 328 of the substrate surface 251 to help form portion of the junction of the solar cell device. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 and about 120 minutes. In one example, the substrate is heated in a nitrogen ($N_2$) rich environment in a rapid thermal annealing (RTA) chamber to a temperature of about 1000° C. for about 5 minutes. After performing the processes in box 608 the heavily doped regions 241 will generally have a shape and pattern matching the shape and pattern of the first dopant material 329 disposed on the surface 251 during the processes performed at box 604. In one example, as schematically shown in FIG. 2A, the pattern of the formed heavily doped regions 241 is configured to match the elements contained in the patterned metal contact structure 242, such as the fingers 260 and busbars 261. The surface 251 will thus contain regions of untextured flat regions 341 and textured regions (e.g., textured surface 351), as illustrated in FIG. 5D.

In one embodiment, an optional cleaning process is performed on the substrate 250 after the process performed in box 608 has been completed to remove any undesirable residue and/or form a passivated surface. In one embodiment, the clean process may be performed by wetting surfaces of the substrate with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning process. The clean process may be performed on the substrate between about 5 seconds and about 600 seconds, such as about 30 seconds to about 240 second, for example about 120 seconds.

At box 610, as shown in FIGS. 5E and 6A, an antireflection layer 354 is formed on the surface 251. In one embodiment, the antireflection layer 354 comprises a thin passivation/antireflection layer (e.g., silicon oxide, silicon nitride layer). In another embodiment, the antireflection layer 354 comprises a thin passivation/antireflection layer (e.g., silicon oxide, silicon nitride layer) and a transparent conductive oxide (TCO) layer. In one embodiment, the passivation/antireflection layer may comprise a thin (20-100 Å) intrinsic amorphous silicon (i-a-Si:H) layer followed by an ARC layer (e.g., silicon nitride), which can be deposited by use of a physical vapor deposition process (PVD) or chemical vapor deposition process.

In box 612, as shown in FIGS. 5F and 6A, portions of the antireflection layer 354 are optionally etched to expose regions 361 of the heavily doped regions 241 so that the subsequently deposited metal layer(s) can be placed in intimate contact with the heavily doped regions 241. In one example, the etched pattern matches the pattern used to form the heavily doped regions 241, such as illustrated in FIG. 2A. Typical etching processes that may be used to patterned the antireflection layer 354 may include but are not limited to patterning and dry etching techniques, laser ablation techniques, patterning and wet etching techniques, or other similar processes. In one embodiment, an etching gel is disposed on the surface 251 using a screen printing process and system discussed herein and shown in FIGS. 3A-3B and 7. In one embodiment, the screen printing process performed by a Softline™ tool available from Baccini S.p.A a division of Applied Materials Inc. of Santa Clara, Calif. An example of an etching gel type dry etching process that can be used to form one or more patterned layers is further discussed in the commonly assigned and copending U.S. patent application Ser. Nos. 12/274,023, filed Nov. 19, 2008, which is herein incorporated by reference in its entirety.

At box 614, as illustrated in FIGS. 5G and 6A, a conductive layer 370 is deposited in a pattern on the heavily doped regions 241 on the surface 251 of the substrate 250. In one embodiment, the formed conductive layer 370 is between about 500 and about 50,000 angstroms (Å) thick, about 10 μm to about 200 μm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). In one example, the conductive layer 370 is a metal paste that contains silver (Ag) or tin (Sn).

Figure 7:
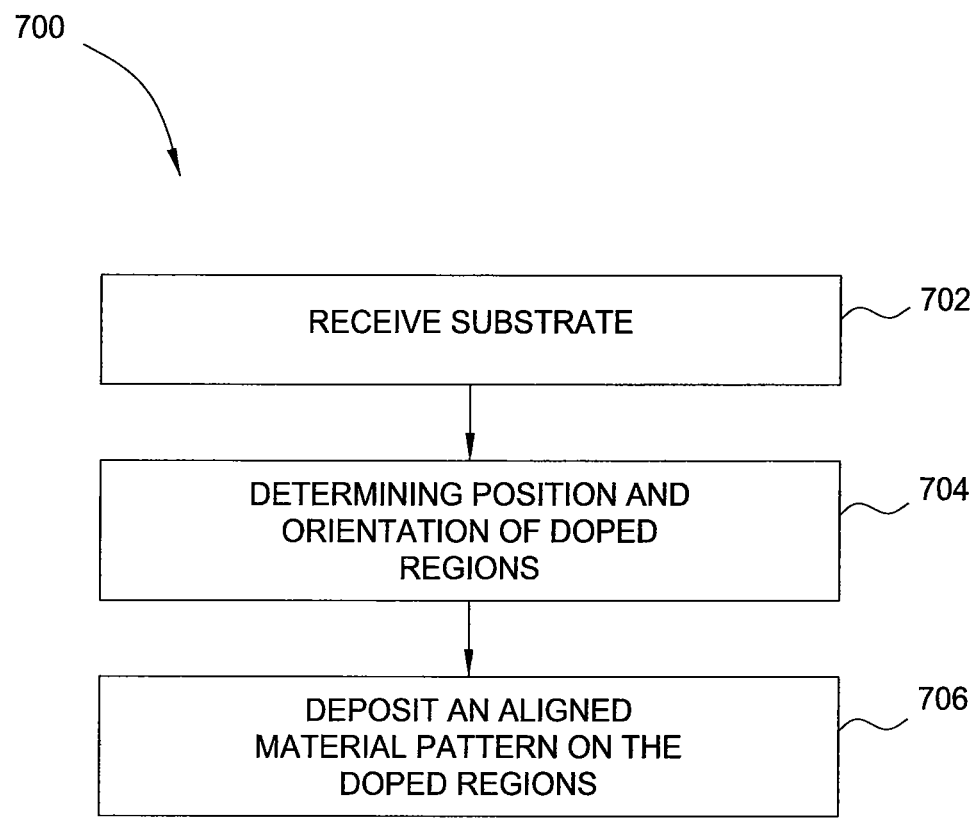
FIG. 7 illustrates a processing sequence used to deposit the conducting layer on a heavily doped region of a solar cell according to embodiments of the invention.

In one embodiment of the processes performed during box 614, as illustrated in FIG. 7, the conductive layer 370 is screen printed on the surface 251 of the substrate 250 using system 100 and the processing steps found in the process sequence 700. The process sequence 700 starts at step 702, in which a printing nest 131 that is in position "1" receives a substrate 250 from the incoming conveyor 111 and "chucks" the substrate on the platen 138.

Next, at step 704, the system controller 101 and an optical inspection system 400, which is similarly configured as the one illustrated in FIG. 4B, are used to detect the pattern of the heavily doped regions 241 by use of the electromagnetic radiation emitted by one of the radiation sources 402 and/or 403 and received by the camera 401A.

Next, at step 706, the rotary actuator assembly 130 rotates the printing nest 131 to the screen print chamber 102 (e.g., path $D_1$). In step 706, the system controller 101 and actuators 102A then orient and align the screen printing mask, which has a desired screen printing pattern formed therein, to the heavily doped regions 241 formed on the substrate 250 using the data received during step 704. Once the screen printing mask is aligned, the conductive layer 370 is disposed on the heavily doped regions 241 by delivering the conductive layer paste or gel through the features formed in the screen printing mask 102B. Subsequently, the processed substrate 250 is then delivered to the outgoing conveyor 112 (e.g., path $D_2$) so that it can be transferred to other subsequent processing chambers.

In an alternate embodiment of step 704 contained in box 614, the optical inspection assembly 200 and system controller 101 are configured to determine the position and orientation of the heavily doped regions 241 formed on the substrate surface 251, due to the contrast created between the textured surface 351 and the flat regions 341 formed during the processing steps contained in boxes 602-612. In this configuration, the optical inspection assembly 200 includes a camera or other similar device that is able to detect the formed pattern due to the variation in surface roughness using ambient light or light from a conventional light bulb or lamp. In one embodiment, the viewing area of the optical inspection assembly 200 is positioned so that it can view and resolve the flat regions 341 versus the regions of textured surface 351 found on the surface 251 (FIG. 8A). Next, using the received information from the optical inspection assembly 200, the system controller 101 then controls deposition of the conductive layer 370 on the flat regions 341, and thus the heavily doped regions 241, following the steps discussed above.

Referring to FIG. 6A, at box 616, heat is delivered to the conductive layer 370 to cause the metal in the conductive layer 370 to form an electrical connection to the heavily doped regions 241. The heating process may be performed in a heating oven adjacent to the screen printing part of the system 100. An example of oven that may be used to perform the process steps in box 616 is further described in the commonly assigned and copending U.S. patent application Ser. Nos. 12/274,023, filed Oct. 24, 2008, which is herein incorporated by reference in its entirety.

Alternate Substrate Processing Sequence

Figure 6B:
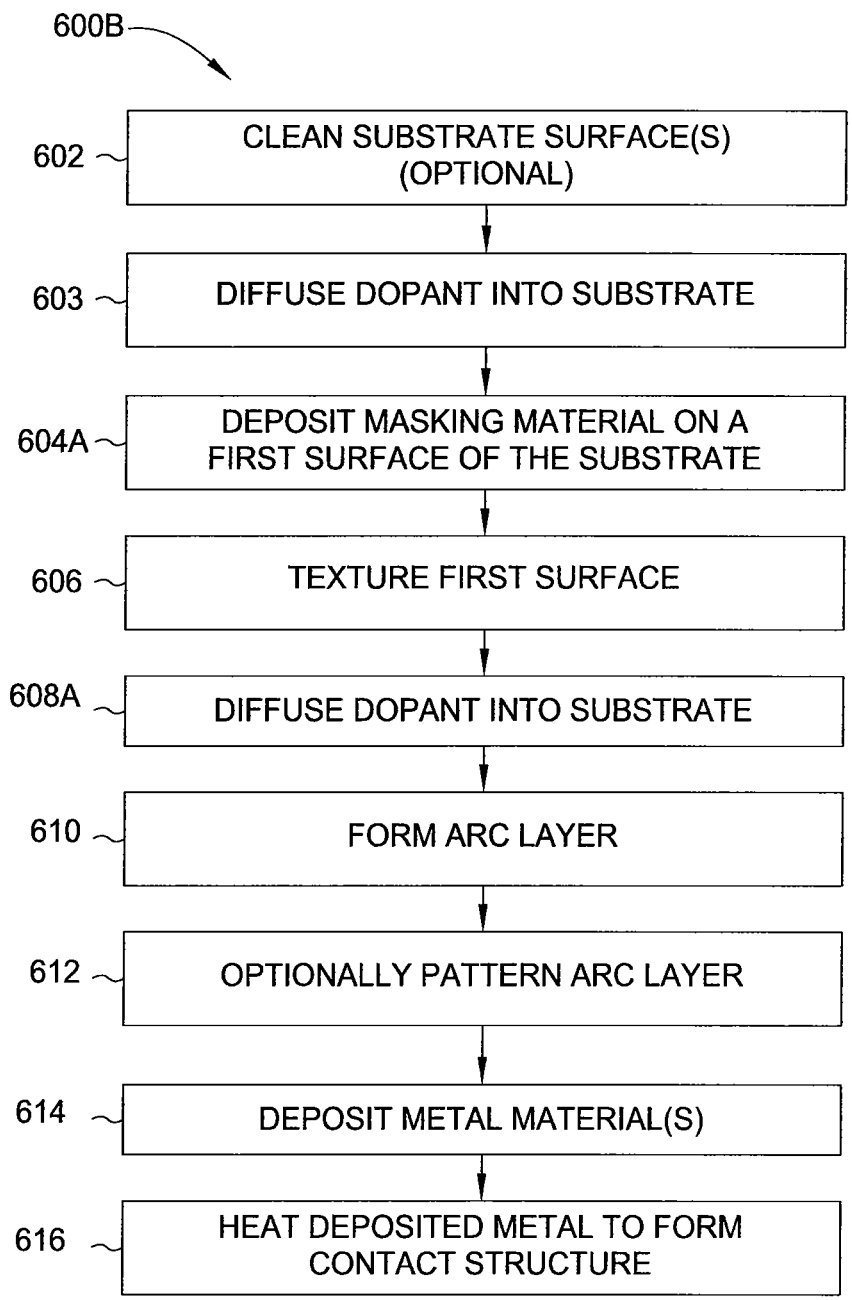
FIG. 6B illustrates a processing sequence used to form a solar cell according to embodiments of the invention.

FIG. 6B illustrates an alternate embodiment of the processing sequence 600A, or processing sequence 600B, which uses two separate doping steps to form a solar cell 300 device that has a metal contact structure formed on a surface 251 of the substrate 250. In general, the processing steps described above in conjunction with FIG. 6A are the same as the steps in the new processing sequence 600B, except that an addition processing step, or box 603, has been added and the original processing steps 604 and 608 have been modified (e.g., boxes 604A and 608A), as discussed below.

At box 603, after optionally performing the steps in box 602, the substrate surface 251 is doped using a conventional doping technique, such as a diffusion furnace type doping technique. In one example, the doped layer formed within the substrate 250 at the substrate surface 251 is a heavily doped region, having properties similar to the heavily doped regions described above. In one embodiment, the conventional doping technique includes a dopant activation step in which the substrate is heated to a temperature greater than about 800° C. to causes the doping elements to diffuse into the surface 251 to form a heavily doped region.

In one embodiment, an optional cleaning process is performed on the substrate 250 after the process performed in box 603 has been completed to remove any undesirable residue and/or form a passivated surface. In one embodiment, the optional clean process is similar to the processes described above in conjunction with FIG. 6A.

At box 604A, after optionally performing the steps in box 603, a masking material is deposited onto one or more isolated regions formed on the surface 251 of the substrate 250. In one embodiment, the masking material is deposited or printed in a desired pattern 230 (FIG. 2A) by the use of screen printing, ink jet printing, rubber stamping or other similar process, such as a screen printing process. The masking material is similar to the first doping material 329 discussed above, but generally does not include the addition of a dopant containing material. The masking material may initially be a liquid, paste, or gel. In general, the masking material is formulated so that it can act as a mask during the subsequent texturization step(s) (box 606). In one embodiment, the masking material is formulated to contain an organic and/or glass like material that is not attacked by the texturization process chemistry and is structurally capable of being a reliable masking material during one or more of the subsequent processing steps. In some cases, after disposing the masking material on the surface 251 the substrate is heated to a desirable temperature to cause the masking material to cure, densify, and/or form a bond with the surface 251. In one embodiment, the masking material is an etch resistant material such as a screen printable silicon dioxide ($SiO_2$) containing material.

At box 606, as shown in FIG. 6B, a texturizing process is performed on the surface 251 of the substrate 250 to form a textured surface thereon, similar to the textured surface 351 illustrated in FIG. 5C. In one embodiment, the regions of the surface 251 that are not covered by the masking material deposited at box 604A, are etched away. In one embodiment of the process performed at box 606, the texturing process is performed until at least most of the heavily doped region formed during box 603 is removed. In one embodiment, the substrate is etched in an etching solution and process similar to the processes described above in conjunction with the processes performed during box 606.

In one embodiment, the masking material is formulated so that it is etched during the texturization process. Therefore, in one embodiment of the processes performed at boxes 604A and 606, a desired thickness of the masking material is deposited on the surface of the substrate so that the substrate material disposed underneath the masking material will remain mostly un-attacked until the texturing process is completed, or at least nearly completed. This configuration will allow the optical inspection system, discussed above, to more easily distinguish between the heavily doped (e.g., formed at box 603) and other regions of the substrate in a subsequent step, due to the contrast in surface roughness.

At box 608A, after performing the steps in box 606, the substrate surface 251 is doped using a conventional doping technique, such as a diffusion furnace type doping technique. In one example, the doped layer formed within the substrate 250 at the substrate surface 251 is a lightly doped region, having a sheet resistance greater than about 50 Ohms per square ($\Omega/\square$). In one embodiment, the conventional doping technique includes a dopant activation step in which the substrate is heated to a temperature greater than about 800° C. to causes the doping elements to diffuse into the surface 251 to form a heavily doped region. In one embodiment, the dopant atoms provided during the processes performed at boxes 603 and 608A are the same type of dopant atom, for example, phosphorous, arsenic or boron. In another embodiment, the dopant atoms provided during the processes performed at boxes 603 and 608A are different dopant atoms.

After performing the process at box 608A the masking material is removed by use of a heating, washing or rinsing process step so that a surface similar to the surface 251 shown in FIG. 5D is formed. In one embodiment, an optional cleaning process is performed on the substrate 250 after the process performed in box 608A has been completed to remove any undesirable residue and/or form a passivated surface. In one embodiment, the clean process may be performed by wetting surfaces of the substrate with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning process. The clean process may be performed on the substrate between about 5 seconds and about 600 seconds, such as about 30 seconds to about 240 second, for example about 120 seconds.

Next, as discussed above in conjunction with FIG. 6B the processing sequence 600B continues on to the processing steps performed in boxes 610-616, which are discussed above in conjunction with FIG. 6A. The processing steps performed in boxes 610-616 thus will not be re-recited here.

Second Alternate Substrate Processing Sequence

Figure 6C:
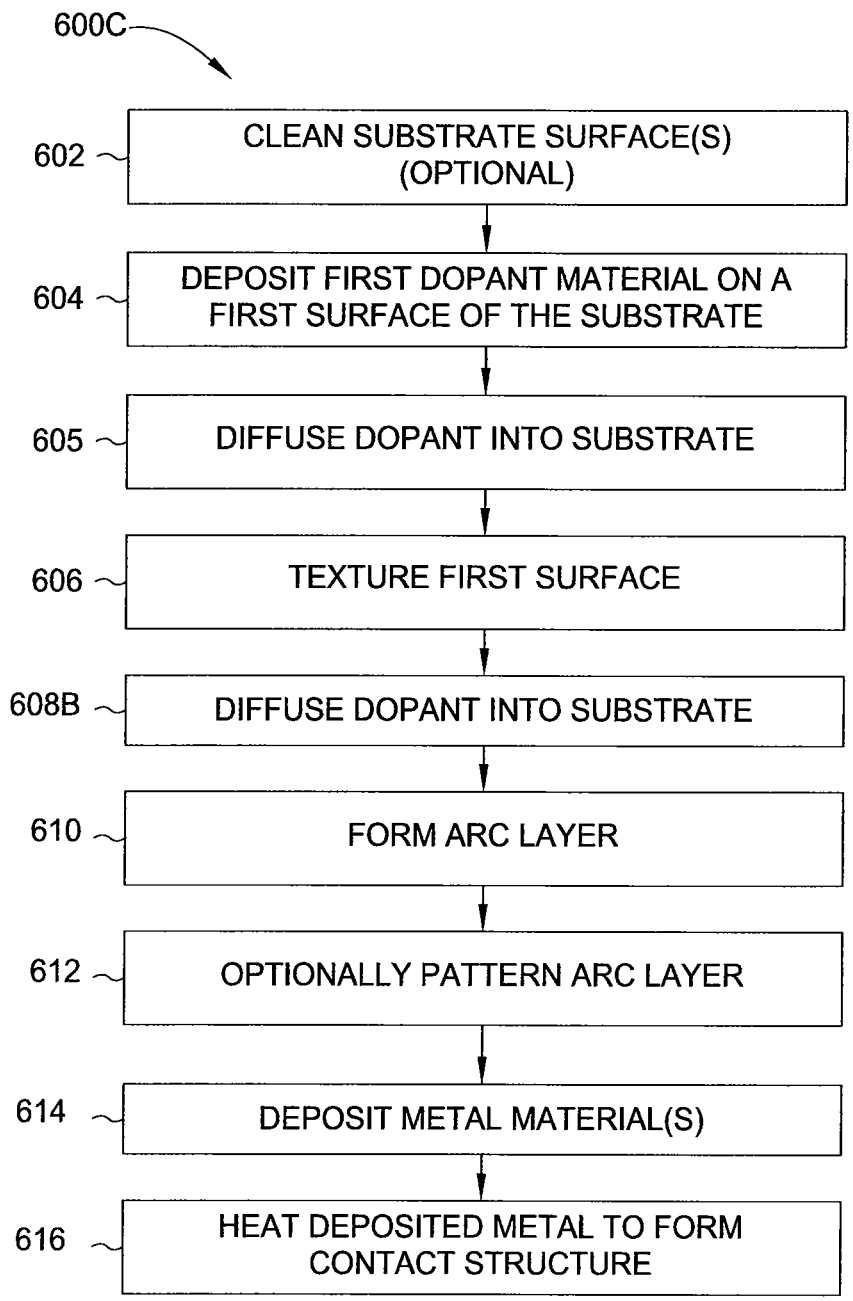
FIG. 6C illustrates a processing sequence used to form a solar cell according to embodiments of the invention.

FIG. 6C illustrates an alternate embodiment of the processing sequence 600A, or processing sequence 600C, which uses two separate doping steps to form a solar cell 300 device that has a metal contact structure formed on a surface 251 of a substrate 250. In general, the processing steps described above in conjunction with FIG. 6A are the same as the steps disclosed in the new processing sequence 600C shown in FIG. 6C, except that an additional processing step, or box 605, has been added and the original processing step 608 has been modified (e.g., box 608B), as discussed below.

At box 605, after performing the steps in box 602 and box 604, the substrate is heated to a temperature greater than about 800° C. to causes the doping elements in the first dopant material 329 to diffuse into the surface 251 of the substrate 250 to form the heavily doped regions 241. In this configuration, the portion of the first dopant material 329 that vaporizes and subsequently dopes the exposed regions of the substrate can be removed in the subsequent texturing process step (e.g., box 606), thus allowing the doping level in the textured surface (e.g., exposed surfaces) to more easily controlled by use of the subsequent doping step performed at box 608B (FIG. 6C). In one embodiment, the substrate having the first dopant material 329 disposed thereon is heated to a temperature between about 800° C. and about 1300° C. in the presence of nitrogen ($N_2$), oxygen ($O_2$), hydrogen ($H_2$), air, or combinations thereof for between about 1 and about 120 minutes. In one example, the substrate is heated in a nitrogen (N$_2$) rich environment in a rapid thermal annealing (RTA) chamber to a temperature of about 1000° C. for about 5 minutes. After performing the processes in box 605, the formed heavily doped regions 241 will generally have a shape and pattern matching the shape and pattern of the first dopant material 329 disposed on the surface 251 during the processes performed at box 604. In one embodiment, it is desirable for a portion of the first dopant material 329 to remain on the surface 251 to act as a texture etching mask.

At box 606, in one embodiment, the doped regions of surface 251 that are not covered by the first dopant material 329 are etched away. In one embodiment, the first dopant material 329 is formulated so that it is etched during the texturization process performed during box 606, which is discussed above. Thus, in one embodiment of the processes performed at boxes 604 and 606, a desired thickness of the first dopant material 329 is deposited on the surface of the substrate so that the substrate material disposed underneath the first dopant material 329 will remain mostly un-attacked until the texturing process is completed, or at least nearly completed. This configuration will allow the optical inspection system, discussed above, to more easily distinguish between the heavily doped (e.g., formed at box 605) and other regions of the substrate in a subsequent step, due to the contrast in surface roughness.

At box 608B, after performing the steps in box 606, which is described above in conjunction with FIG. 6A, the substrate surface 251 is doped using a conventional doping technique, such as a diffusion furnace type doping technique. In one example, the doped layer formed within the substrate 250 is a lightly doped region, having a sheet resistance greater than about 50 Ohms per square ($\Omega/\square$). In one embodiment, the conventional doping technique includes a dopant activation step in which the substrate is heated to a temperature greater than about 800° C. to causes the doping elements to diffuse into the surface 251 to form a heavily doped region. In one embodiment, the dopant atoms disposed in the first dopant material 329 and provided during the processes performed at box 608B are the same type of dopant atom, for example, phosphorous, arsenic or boron. In another embodiment, the dopant atoms disposed in the first dopant material 329 and provided during the processes performed at box 608B are different dopant atoms.

After performing the process at box 608B, in one embodiment, an optional cleaning process is performed on the substrate 250 to remove any undesirable residue and/or form a passivated surface. In one embodiment, the clean process may be performed by wetting surfaces of the substrate with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide (H$_2$O$_2$) solution, or other suitable and cost effective cleaning process. The clean process may be performed on the substrate between about 5 seconds and about 600 seconds, such as about 30 seconds to about 240 second, for example about 120 seconds.

Next, as discussed above in conjunction with FIG. 6C the processing sequence 600C continues on to the processing steps performed in boxes 610-616, which are discussed above in conjunction with FIG. 6A. The processing steps performed in boxes 610-616 thus are not be re-recited here.

It should be noted that additional processing steps may be performed between one or more of the processing steps discussed above in conjunction with FIGS. 6A, 6B and 6C without deviating from the basic scope of the invention described herein. In one example, it may be desirable to form one or more intrinsic silicon and/or doped silicon region on the substrate surface 251 prior to deposition the antireflection layer 354 to form portions of a heterojunction type cell.

Optical Inspection Techniques

In one embodiment, the process sequence 600A includes the formation of one or more alignment marks 801 that are formed prior to depositing the conductive layer 370 on the patterned heavily doped regions 241. The one or more alignment marks 801 are used to help the optical inspection assembly 200 determine the alignment and orientation of the pattern 230. FIG. 8A illustrates one embodiment of the substrate 250 illustrated in FIG. 2A that has a plurality of alignment marks 801 and patterned heavily doped region(s) 241 formed on the surface 251. In one embodiment, it is desirable to form the alignment marks 801 in a known pattern at substantially the same time as the pattern 230 of heavily doped region(s) 241 are formed to assure that the marks are properly aligned to the pattern 230. In this configuration, the optical inspection assembly 200 is used to provide information regarding the actual positional offset ($\Delta X$, $\Delta Y$) and angular offset $\Delta R$ of the heavily doped regions 241 from an ideal position 800 on the surface of the substrate 250 (FIG. 8A). The actual positional offset and the angular offset of the heavily doped region(s) 241 on the surface 251 can thus be more accurately determined by the system controller 101 and used to more accurately adjust the placement of the conductive layer 370 on the heavily doped region(s) 241 in a subsequent step.

Typically, the alignment of the pattern 230 on the surface 251 of the substrate 250 is dependent on the alignment of the pattern 230 to a feature of the substrate 250. In one example, the alignment of the pattern 230 created during box 604 is based on the alignment of the screen printing device to a feature on the substrate, such as edges 250A, 250B (FIG. 8A). The placement of a pattern 230 will have an expected position X and an expected angle orientation R with respect to edges 250A and an expected position Y with respect to an edge 250B of the substrate 250. The positional error of the pattern 230 on the surface 251 from the expected position (X, Y) and the expected angular orientation R on the surface 251 may be described as a positional offset ($\Delta X$, $\Delta Y$) and an angular offset $\Delta R$. Thus, the positional offset ($\Delta X$, $\Delta Y$) is the error in the placement of the pattern 230 of heavily doped region(s) 241 relative to the edges 250A and 250B, and the angular offset $\Delta R$ is the error in the angular alignment of the pattern 230 of heavily doped region(s) 241 relative to the edge 250B of the substrate 250. The misplacement of the screen printed pattern 230 on the surface 251 of the substrate 250 can affect the ability of the formed device to perform correctly and thus affect the device yield of the system 100. However, minimizing positional errors becomes even more critical in applications where a screen printed layer is to be deposited on top of another formed pattern, such as disposing the conductive layer 370 on the heavily doped region(s) 241.

In an effort to improve the accuracy with which the conductive layer 370 is aligned with the heavily doped region(s) 241, embodiments of the invention utilize one or more optical inspection devices, the system controller 101, and one or more alignment marks, which are formed on the surface 251 of the substrate 250 during the formation of the heavily doped region(s) 241 so that the correct alignment of the conductive layer 370 to the heavily doped region(s) 241 can be created. In one embodiment, the conductive layer 370 is aligned in an automated fashion to the heavily doped region(s) 241 by use of the information received by the system controller 101 from the one or more optical inspection devices and the ability of the system controller 101 to control the position and orientation of the screen printing mask relative to heavily doped region(s) 241 using the one or more actuators 102A found in the screen print chamber 102. In one embodiment, the optical inspection device includes one or more components contained in the inspection assembly 200. In one embodiment, the one or more alignment marks 801, or fiducial marks, may be formed in a pattern similar to the ones illustrated in FIGS. 9A-9D, which are described below. The alignment marks 801 may be formed on unused areas of the surface 251 of the substrate 250 to prevent the alignment marks 801 from affecting the performance of a formed solar cell device.

Figure 8B:
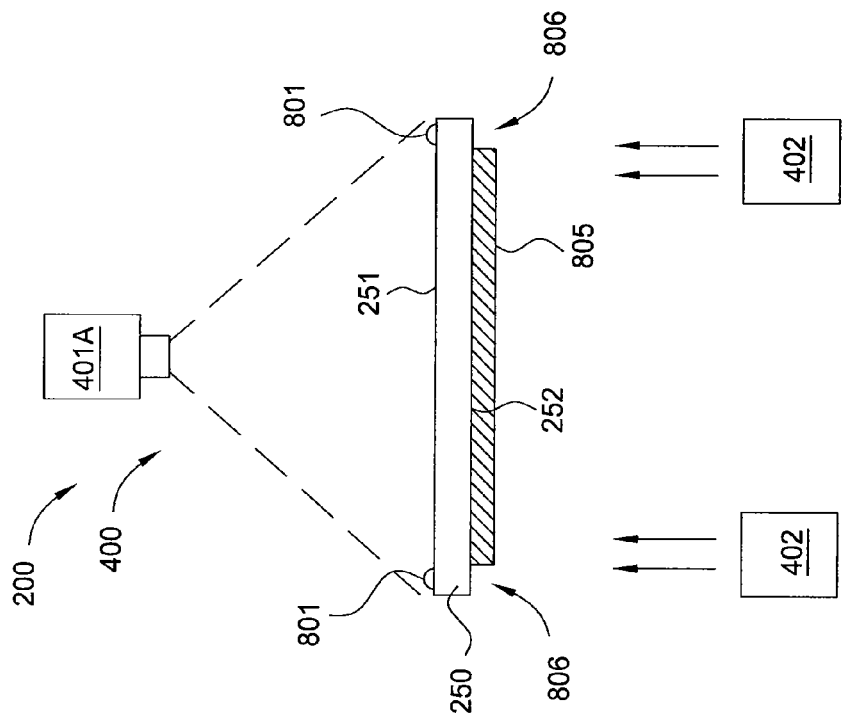
FIG. 8B is side cross-sectional view of a surface of a substrate that has a heavily doped region, alignment marks and an obscuring material formed thereon according to one embodiment of the invention.
Figure 8A:
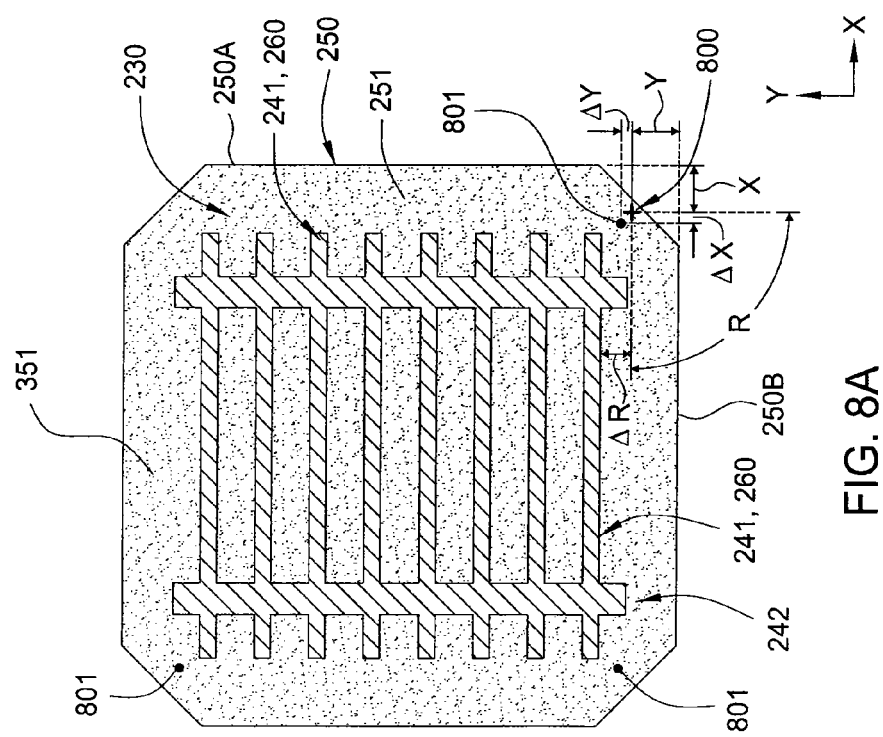
FIG. 8A is plan view of a surface of a substrate that has a heavily doped region and alignment marks formed thereon according to one embodiment of the invention.

In some solar cell processing sequences, as shown in FIG. 8B, at least a portion of a surface of the substrate 250 is coated with an obscuring material 805 that blocks the optical inspection assemblies 200 ability to detect the pattern 230. In one example, a metal coating is disposed on the surface 252 opposite the surface 251, thus affecting the ability of the optical inspection assembly 200 to directly determining the pattern 230 of heavily doped region 241. In on example, an optical inspection system 400 is prevented from transmitting the electromagnetic radiation from the radiation source(s) 402 through all regions of the substrate 250. Therefore, in one embodiment, it is desirable to selectively remove portions of the obscuring material 805 from one or more regions 806 (e.g., edge regions) and position one or more alignment marks 801 over or within the one or more regions 806 so that the pattern 230 of heavily doped regions 241 can still be determined or inferred from the position of the alignment marks 801.

FIG. 9A illustrates various examples of alignment marks 801, for example alignment marks 801A-801D, that may be formed on the surface 251 of the substrate 250 during the process of forming the heavily doped region(s) 241 and used by the inspection assembly 200 to find the positional offset ($\Delta X$, $\Delta Y$) and the angular offset $\Delta R$ of the heavily doped region(s) 241. In one embodiment, the alignment marks 801 may have a circular shape (e.g., alignment mark 801A), a rectangular shape (e.g., alignment mark 801B), a cross shape (e.g., alignment mark 801C), or an alphanumeric shape (e.g., alignment mark 801D). It is generally desirable to select an alignment mark 801 shape that allows the pattern recognition software found in the system controller 101 to resolve the actual position of the alignment mark 801, and thus the actual position of the heavily doped region(s) 241 on the surface 251 of the substrate 250 from the image viewed by the inspection assembly 200. The system controller 101 is then adapted to resolve the positional offset ($\Delta X$, $\Delta Y$) and the angular offset $\Delta R$ and adjust the screen printing device to minimize the positional misalignment and an angular misalignment when printing the conductive layer 370.

In one embodiment, the alignment marks 801 are formed from the same material that is used to form the heavily doped region(s) 241, and thus can be detected by use of the optical inspection system 400 using the techniques described above. In this configuration, the alignment marks 801 can be formed at the same time as the heavily doped region(s) 241. In another embodiment, the alignment marks 801 are etched or scribed into the surface 251 of the substrate 250 using a laser ablation, mechanical scribing or dry etching techniques prior to the formation of the heavily doped regions 241 so that the pattern 230 of heavily doped region(s) 241 can be aligned to the formed alignment marks 801 during box 604 (FIG. 6A) and the conductive layer 370 can be aligned to the alignment marks 801 during box 614.

FIGS. 9B-9D illustrate various configurations of alignment marks 801 on the surface 251 of the substrate 250 that may be used to improve the accuracy of the offset measurements calculated by the system controller 101 from the images received by the components in the inspection assembly 200. FIG. 9B illustrates one configuration in which two alignment marks 801 are placed near opposite corners on the surface 251 of the substrate 250. By spreading the alignment marks 801 as far apart as possible, the relative positional error between a feature on the substrate 250, such as the edge 250A or 250B, and the pattern 230 may be more accurately resolved. FIG. 9C illustrates another configuration in which three alignment marks 801 are printed on the surface 251 of the substrate 250 near various corners to help resolve the offset of the pattern 230 of heavily doped regions 241.

FIG. 9D illustrates another configuration in which three alignment marks 801 are printed in strategic positions across the surface 251 of the substrate 250. In this embodiment, two of the alignment marks 801 are positioned in a line parallel to the edge 250A, and the third alignment mark 801 is positioned a distance perpendicular to the edge 250A. In this configuration, the pattern recognition software in the system controller 101 creates perpendicular reference lines $L_1$ and $L_2$ to provide additional information about the position and orientation of the heavily doped region(s) 241 relative to the substrate 250.

FIG. 10 is a schematic isometric view of one embodiment of the rotary actuator assembly 130 in which the inspection assembly 200 includes a plurality of optical inspection devices, such as two or more optical inspection devices. In one example, the inspection assembly 200 includes three cameras 401B, 401C, and 401D that are adapted to view three different regions of the surface 251 of the substrate 250 that has been illuminated by one or more radiation sources, such as a radiation source 403. In one configuration, the cameras 401B, 401C, and 401D are each positioned to view a region of the surface 251 of the substrate 250 having a formed alignment mark 801 contained thereon. The accuracy of the placement of the heavily doped region(s) 241 can be improved due to the ability to reduce the size of each of the respective viewing areas 122A, 122B, and 122C, and thus increase the resolution or number of pixels per unit area, while still allowing the positions of the alignment marks 801 to be spread across the surface 251 of the substrate 250 as much as possible to reduce the amount of alignment error.

In one embodiment, during processing, the inspection assembly 200 and system controller 101 capture images of at least two of the alignment marks 801 formed on the surface 251 of the substrate 250. The images are read by the image recognition software in the system controller 101. The system controller 101 then determines the positional offset ($\Delta X$, $\Delta Y$) and the angular offset $\Delta R$ of the screen printed pattern by analyzing the at least two alignment marks 801 and comparing them with the expected position (X, Y) and angular orientation R. The system controller 101 then uses the information obtained from this analysis to adjust the position of the screen printing mask in the screen print chamber 102 to allow for the aligned placement of a conductive layer 370 over the heavily doped region(s) 241.

In another embodiment, the optical inspection assembly 200 and system controller 101 capture images of three alignment marks 801 that are disposed on the substrate surface 251. In one embodiment, the system controller 101 identifies the actual position of the three alignment marks 801 relative to a theoretical reference frame. The system controller 101 then determines the offset of each of the three alignment marks 801 from the theoretical reference frame and uses a coordinate transfer algorithm to adjust the position of the screen printing device within the printing chamber 102 to an ideal position for subsequently printing the conductive layer 370 with significantly more accurate alignment with respect to the heavily doped region(s) 241. In one embodiment, the method of ordinary least squares (OLS) or a similar method may be used to optimize the ideal position of the screen printing device for printing the conductive layer 370. For instance, the offset of each of the alignment marks 801 from the theoretical reference frame may be determined, and the ideal position of the screen printing device may be optimized according to a function that minimizes the distance between the actual position of the alignment marks 801 and the theoretical reference frame. The alignment mark position information received by the system controller 101 during the position capturing process is thus used to orient and position the conductive layer 370 relative to the actual position of the alignment marks 801 created during the formation of the heavily doped region(s) 241. Therefore, the error in the placement of the conductive layer 370 is reduced, since the placement of the conductive layer 370 relies on the actual position of the heavily doped region(s) 241, and not the relationship of the heavily doped region(s) 241 to a feature of the substrate 250 and then conductive layer 370 to the feature(s) of the substrate 250. One skilled in the art will appreciate that the placement of the heavily doped region(s) 241 relative to the feature of the substrate 250 and then the conductive layer 370 relative to the feature of the substrate 250 provides approximately double the error of directly aligning the conductive layer 370 relative to the heavily doped region(s) 241.

Integrated Alignment Configurations

FIG. 11A illustrates one embodiment of an alignment mark 1102 formed on the surface 251 of the substrate 250 during the formation of the heavily doped regions 241. The alignment marks 1102 are thus used to improve the accuracy of the placement of the fingers 260 and buss bars 261 on the heavily doped regions 241. It should be noted that the placement and/or alignment of the fingers 260 and buss bars 261 to the heavily doped regions 241 is important, since the poor placement of the fingers 260 and buss bars 261 can cause a short circuit to form between the opposing regions of the solar cell device.

FIG. 11B is a close-up view that illustrates one configuration of an alignment mark 1102, which can be placed on opposite corners on the surface 251 of the substrate 250. FIG. 11C is a cross-sectional view formed by cutting along a section line 11C-11C (FIG. 11B) that passes through a portion of an alignment mark 1102 formed in the substrate 250. The orientation and alignment data collected by the detector assembly 401 can be used by the system controller 101 which is configured to adjust and control the placement of the metal contact structure (e.g., fingers 260 and buss bars 261) on the surfaced of the heavily doped regions 241 by use of a patterned metallization technique. In one embodiment, the metal contacts are disposed on the surface of the substrate 250 using a screen printing process performed in a screen printing system 100, as discussed above in conjunction with FIGS. 3A-3D.

In one embodiment, the alignment mark 1102 comprises a pattern of nested features, such as the outer feature 1110, middle feature 1111, and inner feature 1112 that are formed on the substrate 250 using the steps discussed above in conjunction with FIGS. 5A-5G, 6A and 7. The process of forming the alignment mark 1102 and heavily doped region(s) 241 on the surface of the substrate 250 may include the use of a patterned mask and conventional doping process(es). In one example, the pattern masking process may include patterning an oxide layer, or a photoresist material, and the conventional doping process may include an ion implantation process or a diffusion furnace type doping process. In one example, the process of forming the alignment mark 1102 and other heavily doped region(s) 241 includes the following steps. First, a dielectric layer (e.g., silicon oxide, silicon nitride) is deposited on the surface 251 of the substrate. Next, a pattern is formed in the dielectric layer using one or more patterning techniques, such as laser ablation, patterned etchant materials, and/or conventional photolithography and wet or dry etching techniques. An example of a patterned etchant material process is further described in the commonly assigned U.S. patent application Ser. No. 12/274,023, which is herein incorporated by reference in its entirety. Finally, the heavily doped region(s) 241 are formed using a high temperature diffusion furnace type doping step (~T≥800° C.), in which components of a doping gas (e.g., $POCl_3$) are driven into the exposed surfaces of the substrate formed during the prior patterning step. In some cases, an optional clean step may be performed after the doping step to remove the pattern dielectric layer and exposed substrate surfaces.

Figure 11E:
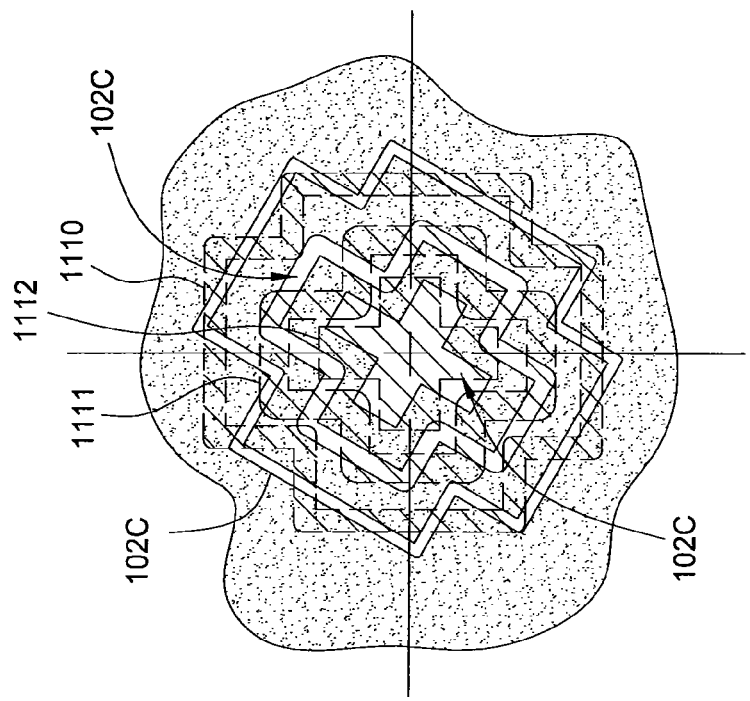
FIG. 11E is a plan view that illustrates an example of an alignment mark and screen printing mask according to one embodiment of the present invention.
Figure 11D:
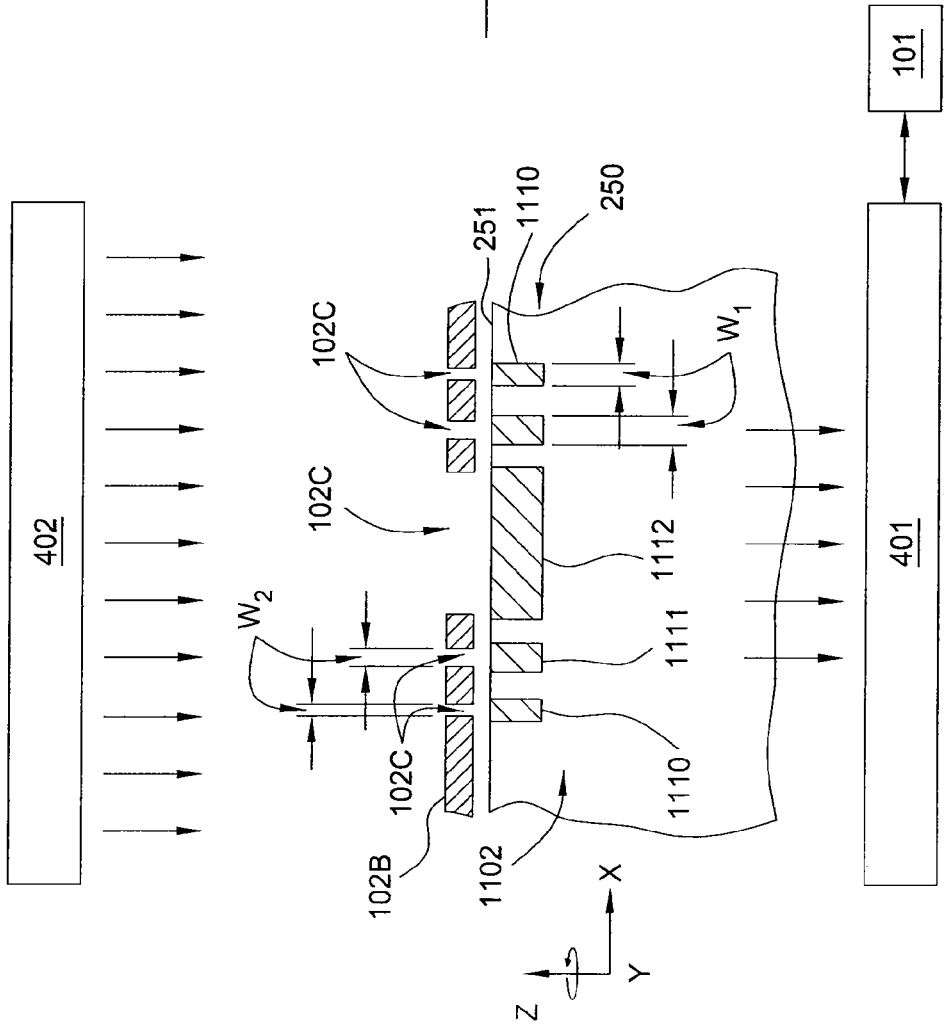
FIG. 11D is a schematic cross-sectional view of an optical inspection system used to align a screen printing mask to a substrate according to one embodiment of the invention.

In one embodiment, as shown in FIGS. 11D and 11E, the position and/or angular orientation of a screen printing mask 102B (FIG. 3A) is aligned relative to the alignment mark 1102 using the optical inspection system 400, one or more actuators (e.g., substrate movement actuator, actuator 102A) and system controller 101. In this configuration, the alignment of the screen printing mask 102B relative to the alignment mark 1102 is determined by use of the emitted radiation from the radiation source 402, which is projected through the features 102C formed in the screen printing mask 102B and is collected by the detector assembly 401. In one example, the feature 1110 in the alignment mark 1102 has an outer dimension in the x-direction and/or in the y-direction that is about 1 mm in size, while the width $W_1$ of each of the features 1110, 1111 and/or 1112 are between about 100 and 120 µm. In one configuration, the outer feature 1110, middle feature 1111, and inner feature 1112 are all equally spaced in a nested pattern relative to each other. The outer feature 1110, middle feature 1111, and inner feature 1112 may each be separated by a gap G (FIG. 11C) formed there between. In one embodiment, the features 102C in a screen printing mask 102B are configured so that at least one feature 102C is nominally positioned at the center line of each of the nested features, and each feature 102C are about 20-40 µm smaller in width $W_2$ than the width $W_1$. It is believed that by configuring the features 102C so that they are smaller in width than the alignment mark features, it will generally be easier to reliably align the printing mask 102B to the alignment mark 1102. In one example, the width $W_2$ is between about 60 and about 80 µm. In general, the screen printing mask 102B to heavily doped region 241 alignment can be detected by the optical contrast formed between the heavily doped regions 241 found in the alignment mark 1102 and the substrate 250 material which are viewed through the features 102C formed in the screen printing mask 102B. In one example, if the features 102C are desirably aligned relative to the alignment mark 1102, no optical contrast will be seen by the detector assembly 401 and system controller 101, since each of the features 102C will be positioned over its respective nested features 1110, 1111 and 1112. FIG. 11E is a close-up plan view illustrating a configuration where the features 102C in the screen printing mask 102B are mis-aligned relative to the alignment mark 1102 prior to any adjustment being made by the actuators 102A and system controller 101. In this configuration, the detector assembly 401 can be used to detect the variation in intensity of the electromagnetic radiation passing through the features 102C and received by that detector assembly 401, due to the interaction of the electromagnetic radiation with portions of the alignment mark 1102 (e.g., nested features 1110, 1111 and 1112) and adjacent regions of the substrate 250 (e.g., non-heavily doped regions). In one embodiment, the system controller 101 is used to adjust the orientation and/or position of the screen printing mask 102B relative to the substrate 250 until the variation in intensity across at least two or more parts of the image formed by a camera in the detector assembly 401 is within a desirable range. In one example, the variation in intensity across at least two or more parts of the image formed by a camera is adjusted until the variation is minimized, which may coincide with the features 102C, which have a width $W_2$ smaller than the Width $W_1$, being positioned directly over and oriented with the nested features 1110, 1111 and/or 1112.

Figure 11G:
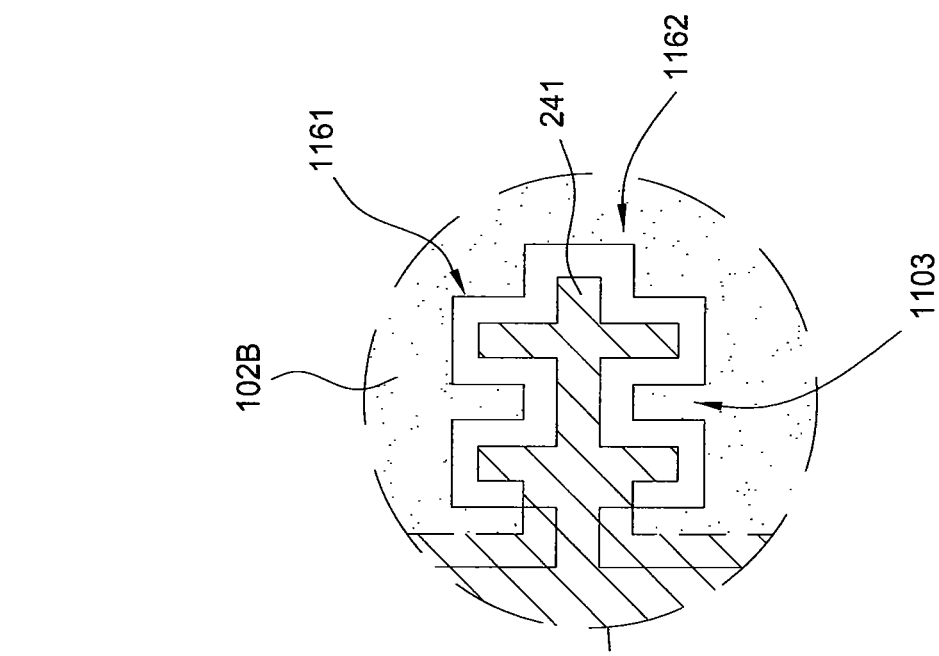
FIG. 11G is a close-up plan view of a screen printing mask disposed over a surface of a substrate that has a heavily doped region and alignment marks formed thereon according to one embodiment of the invention.
Figure 11F:
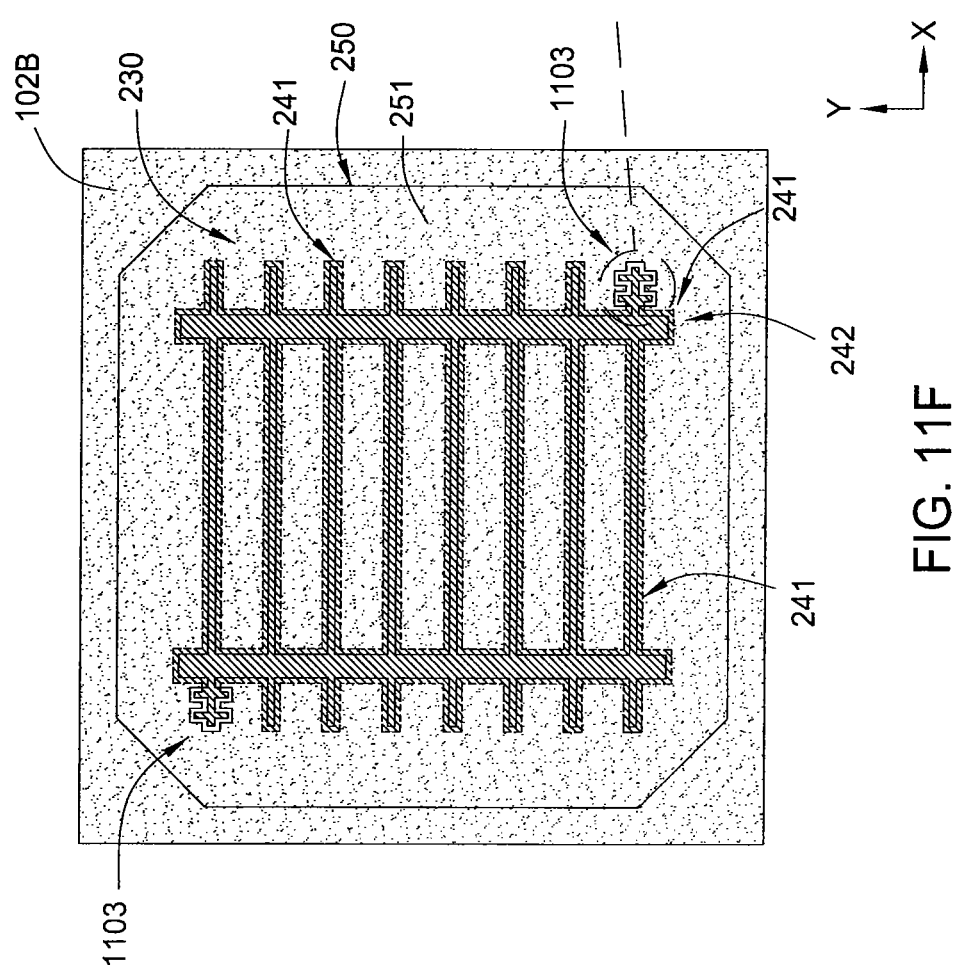
FIG. 11F is a plan view of a screen printing mask disposed over a surface of a substrate that has a heavily doped region and alignment marks formed thereon according to one embodiment of the invention.

Referring FIGS. 11F and 11G, in one embodiment, the position and/or angular orientation of a screen printing mask 102B to the heavily doped region(s) 241 is adjusted using an alignment mark 1103, the optical inspection system 400, one or more actuators (e.g., substrate positional actuator, actuator 102A) and the system controller 101. FIG. 11F illustrates one embodiment of an alignment mark 1103 that is formed as part of the heavily doped region 241. FIG. 11F also illustrates a screen printing mask 102B that is positioned over and aligned to the alignment marks 1103. FIG. 11G is a close-up of a portion of FIG. 11F illustrating a configuration where the screen printing mask 1028 is aligned to the alignment mark 1103. In one configuration, an opening 1161 in the screen printing mask 102B is sized so that edges of the alignment mark 1103 can be viewed by the components in an optical inspection system 400 to determine the position and/or orientation errors using the optical contrast created between the heavily doped regions 241 found in the alignment mark 1103 and the substrate 250. The alignment marks 1103 are thus used by the system controller 101 to improve the accuracy of the placement of the fingers 260 and buss bars 261 on the heavily doped regions 241 during a subsequent processing step. In configurations where the opening 1161 in the screen printing mask 102B are sized so that edges of the alignment mark 1103 are inside the opening 1161, it may be desirable to place these alignment mark(s) 1103 within unused regions of the substrate 250, since the metal that is disposed through the opening 1161 and onto the un-heavily doped regions of the substrate surface during the screen printing process can cause shorts that will affect the solar cell's performance.

Alternate Solar Cell Formation Processing Steps

FIGS. 12A-12H illustrate schematic cross-sectional views of a solar cell substrate 250 during different stages of a processing sequence used to form a solar cell 1200 device that has a metal contact structure formed on a surface 251. FIG. 13 illustrates a process sequence 1300 used to form the active region(s) and metal contact structure on the solar cell 1200. The sequence found in FIG. 13 corresponds to the stages depicted in FIGS. 12A-12H, which are discussed herein.

At box 1302, and as shown in FIGS. 12A and 13, the surfaces of the substrate 250 are cleaned to remove any undesirable material or roughness. In one embodiment, the clean process may include the steps discussed above in conjunction with step 602.

At box 1306, as shown in FIGS. 12B and 13, a texturizing process is performed on the surface 251 of the substrate 250 to form a textured surface 351. In one embodiment, the surface 251 is the front side of a solar cell substrate that is adapted to receive sunlight after the solar cell has been formed. The surface 251 of the substrate 250 may be etched using the steps discussed above in conjunction with step 606.

At box 1308, as shown in FIGS. 12C and 13, the substrate is heated to a temperature greater than about 800° C. in the presence of a dopant containing gas to causes the doping elements in the dopant containing gas to diffuse into the surface 251 to form a lightly doped region 1242. In one embodiment, the substrate is heated to a temperature between about 800° C. and about 1300° C. in the presence of phosphorus oxychloride ($POCl_3$) containing gas for between about 1 and about 120 minutes.

In one embodiment, an optional cleaning process is performed on the substrate 250 after the process performed in box 1308 has been completed to remove any undesirable residue and/or form a passivated surface. In one embodiment, the clean process may be performed by wetting the surfaces of the substrate with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning process. The clean process may be performed on the substrate between about 5 seconds and about 600 seconds, such as about 30 seconds to about 240 second, for example about 120 seconds.

At box 1310, as shown in FIGS. 12D and 13, an antireflection layer 1254 is formed on the surface 251. In one embodiment, the antireflection layer 1254 comprises a thin passivation/antireflection layer (e.g., silicon oxide, silicon nitride layer). In another embodiment, the antireflection layer 1254 comprises a thin passivation/antireflection layer (e.g., silicon oxide, silicon nitride layer). In one embodiment, the passivation/antireflection layer may comprise a thin (e.g., 20-100 Å) intrinsic amorphous silicon (i-a-Si:H) layer followed by an ARC layer (e.g., silicon nitride), which can be deposited by use of a physical vapor deposition process (PVD) or chemical vapor deposition process.

Figure 12E:
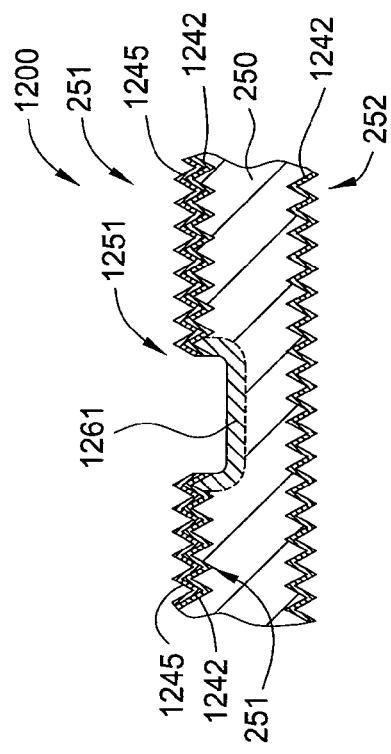
Figure 13:
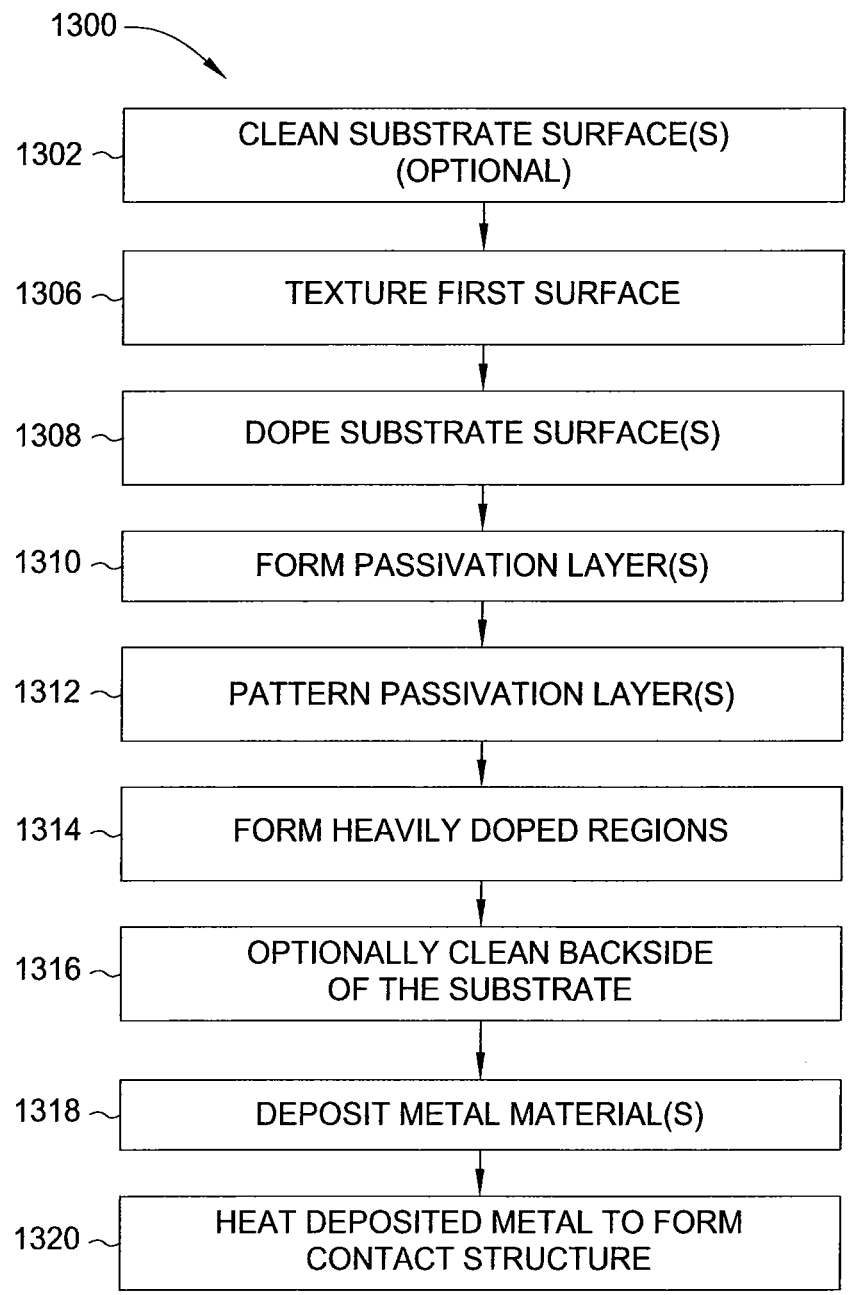
FIG. 13 illustrates a processing sequence used to form a solar cell according to embodiments of the invention.

In box 1312, as shown in FIGS. 12E and 13, portions of the passivation layer 1245 are optionally etched to expose a plurality of patterned regions 1251 on the surface of the substrate 250 so that the subsequently deposited metal layer(s) can be placed in intimate contact with the surface of the substrate 250 in a subsequent step. Typical etching processes that may be used to patterned the passivation layer 1245 may include but are not limited to patterning and dry etching techniques, laser ablation techniques, patterning and wet etching techniques, or other similar processes. In one embodiment, a laser 1290 is used to ablate the layers of material found in the passivation layer 1245 and re-melt, or remove, a portion of the substrate 250 material, which also generally creates a surface that is smoother than the textured surface formed in step 1306. In one example, the laser 1290 is a pulsed IR wavelength laser that is scanned across the surface of the substrate 250 to form the patterned regions 1251. In one embodiment, part of the process of forming patterned regions 1251 includes forming one or more alignment marks (e.g., FIGS. 9A-9D, 11B, and 11G) on a region of a surface of the substrate 250 by use of a patterning technique.

Figure 12F:
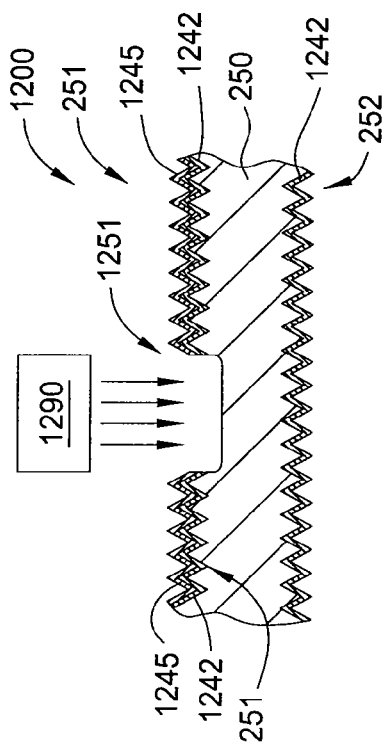

At box 1314, as illustrated in FIGS. 12F and 13, the substrate is heated to a temperature greater than about 800° C. in the presence of a dopant containing gas to causes the doping elements in the dopant containing gas to diffuse into the patterned regions 1251 to form a heavily doped region 1261. The passivation layer 1245 thus enables the heavy doping of the exposed patterned regions 1251, while acting as a mask that tends to prevent the doping of other regions of the substrate surface. In one configuration, a thin silicon dioxide or silicon nitride passivation layer 1245 is used as a sacrificial masking layer that is removed in a subsequent step. In one example of the processes performed in box 1314, a crystalline p-type doped substrate is heated to a temperature between about 800° C. and about 1300° C. in the presence of phosphorus oxychloride ($POCl_3$) containing gas for between about 3 and about 120 minutes.

In another embodiment of the process sequence 1300, the processes performed in boxes 1312 and 1314 are combined into one single step. In this case, the heavily doped region 1261 is formed during the processes performed during the step(s) discussed in conjunction with box 1312, which are herein referred to as a laser doping process. In this configuration the heavily doped regions 1261 are formed by positioning the substrate in a dopant gas containing environment while the patterned regions 1251 are formed on the surface of the substrate 250 using a laser ablation process. In one embodiment, the doped amorphous silicon (i-a-Si:H) layer in the passivation layer 1245 is used to help form the heavily doped regions 1261 by the use of the heat delivered to the doped amorphous silicon (i-a-Si:H) layer and the substrate surface during the laser ablation process.

Figure 12G:
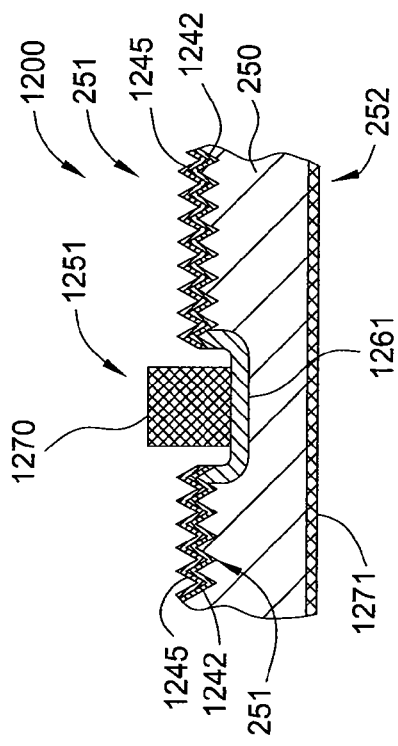

At box 1316, in one embodiment, an optional cleaning process is performed on the substrate 250 after the process performed in box 1314 has been completed to remove the amorphous silicon (i-a-Si:H) layer in the passivation layer 1245, remove any residue left over from the processes performed in box 1314 and/or form a passivated surface over the exposed patterned regions 1251. In one embodiment, the clean process may be performed by wetting surfaces of the substrate with a cleaning solution. In one embodiment, the clean process may be performed by wetting the substrate with a cleaning solution, such as an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning process. The clean process may be performed on the substrate between about 5 seconds and about 600 seconds, such as about 30 seconds to about 240 second, for example about 120 seconds. In one embodiment, as shown in FIG. 12G, the clean process may also include a step of mechanically polishing or abrading of the surface 252 of the substrate 250 to remove the unwanted material from a surface. In one embodiment, as in any of the cleaning processes discussed herein, the wet clean process may be performed using a spray/mist chemical clean process in a rinse/spin dry apparatus.

Figure 12H:
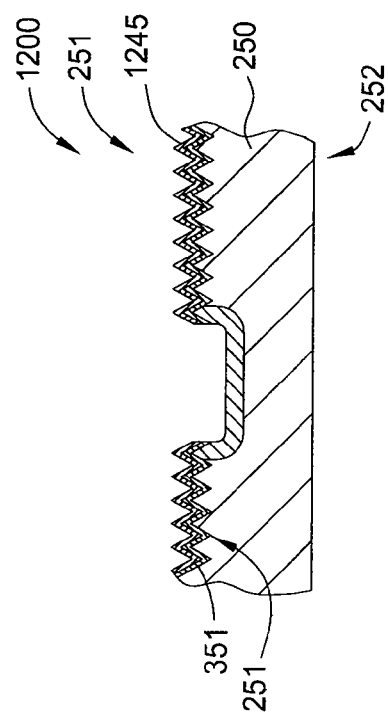

At box 1318, as illustrated in FIGS. 12H and 13, a conductive feature 1270 is deposited in a pattern on the heavily doped regions 1261 on the surface 251 of the substrate 250. In one embodiment, the formed conductive feature 1270 is between about 500 and about 50,000 angstroms (Å) thick, about 10 µm to about 200 µm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). In one example, the conductive feature 1270 is a metal paste that contains silver (Ag) or tin (Sn).

In one embodiment of the processes performed during box 1318, a conductive feature 1270 is screen printed on the surface 251 of the substrate 250 using system 100 and the processing steps found in the process sequence 700, which are discussed above. In this process, the optical inspection system 400 is used to detect the pattern of the heavily doped regions 1261 by use of desirable wavelength(s) of electromagnetic radiation emitted by one of the radiation sources 402 and/or 403 and received by the camera 401A. In another embodiment, the optical inspection assembly 200 is able to detect the formed pattern due to the variation in surface roughness created between the substrate's textured surfaces and the patterned regions 1251 using ambient light or light from a conventional light bulb or lamp. Next, the system controller 101 and actuators 102A then orient and align the screen printing mask, which has a desired screen printing pattern formed therein, to the heavily doped regions 1261 formed on the substrate 250 using the data received during by the system controller. Once the screen printing mask is aligned, the conductive features 1270 are disposed on the heavily doped regions 1261 by delivering the conductive layer paste or gel through the features formed in the screen printing mask 102B.

Further, in one embodiment of the processes performed during box 1318, a back metal layer 1271 is formed on the surface 252 of the substrate 250 using a conventional deposition process, such as a screen printing or a PVD process. In one embodiment, the formed back metal layer 1271 is between about 500 and about 50,000 angstroms (Å) thick, and contain a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr).

At box 1320, heat is delivered to the conductive feature 1270 and substrate 250 to cause the metal in the conductive feature 1270 to form an electrical connection to the heavily doped regions 1261. The heating process may be performed in a heating oven adjacent to the screen printing part of the system 100, as discussed above.

Alternate Selective Emitter Formation Process

Figure 14A:
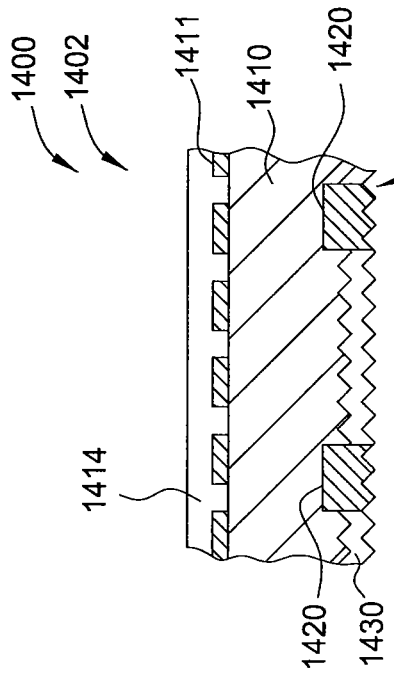
FIGS. 14A-14D illustrate schematic cross-sectional views of a solar cell substrate during different stages of a processing sequence used to form active regions of a solar cell device.
Figure 14B:
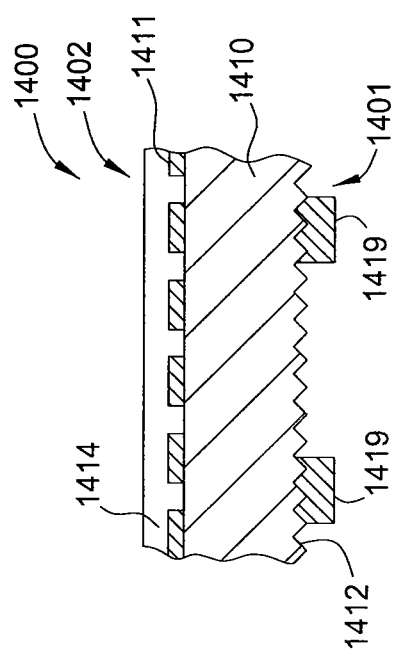
Figure 14C:
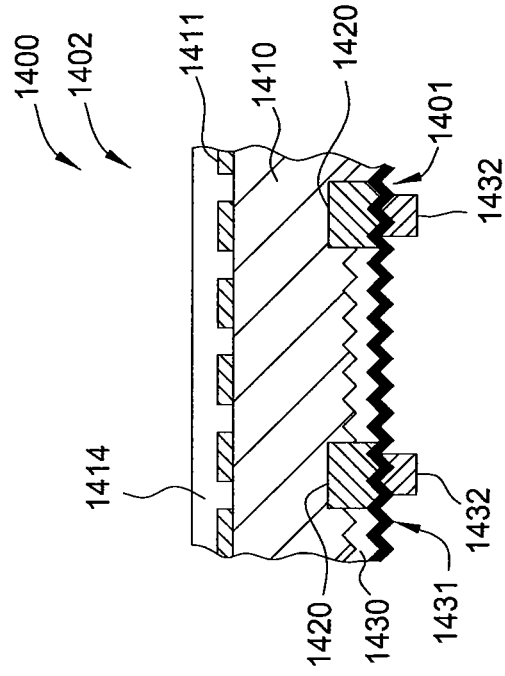
Figure 14D:
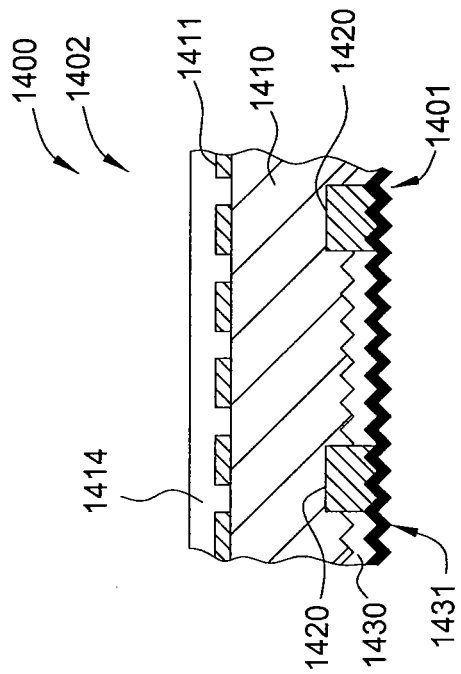

FIGS. 14A-14D illustrate an alternative embodiment of the present invention, illustrating schematic cross-sectional views of a solar cell substrate 1410 during different stages in a processing sequence performed to form active regions of a solar cell device. The process sequence 1600 illustrated in FIG. 15 corresponds to the stages depicted in FIGS. 14A-14D, which can be used to form a selective emitter structure on the front surface 1401 of the solar cell device, such as solar cell 1400. In one embodiment, as shown in FIG. 14D, the formed solar cell 1400 generally contains a substrate 1410, heavily doped regions 1420, and a contact layer 1414, which is disposed on back surface 1402 of the substrate 1410. In one example, the substrate 1410 is p-type doped crystalline silicon substrate. In one configuration, the contact layer 1414 is disposed over a dielectric layer 1411, such as silicon dioxide layer, silicon nitride layer or silicon oxynitride layer, which is formed or deposited on the back surface 1402. In one embodiment, the contact layer 1414 comprises a metal that is between about 2000 angstroms (Å) and about 50,000 angstroms (Å) thick. In one embodiment, the contact layer 1414 is a refractory metal or refractory metal alloy layer, such as titanium (Ti), tantalum (Ta), tungsten (W), molybdenum (Mo), titanium nitride (TiN), tantalum nitride (TaN), tungsten nitride (WN), and/or molybdenum nitride (MoN). The refractory metal, or refractory metal alloy, containing contact layer 1414 is thus able to be present during some of the high temperature processing steps found in process sequence 1600 discussed below. However, the presence of the refractory metal, or refractory metal alloy, containing contact layer 1414 is not intended to be limiting as to the scope of the invention, since the contact layer 1414 could in some cases be deposited after the high temperature processes are performed. In one embodiment, the front surface 1412 is textured to improve the light trapping of the formed solar cell 1400.

Figure 15:
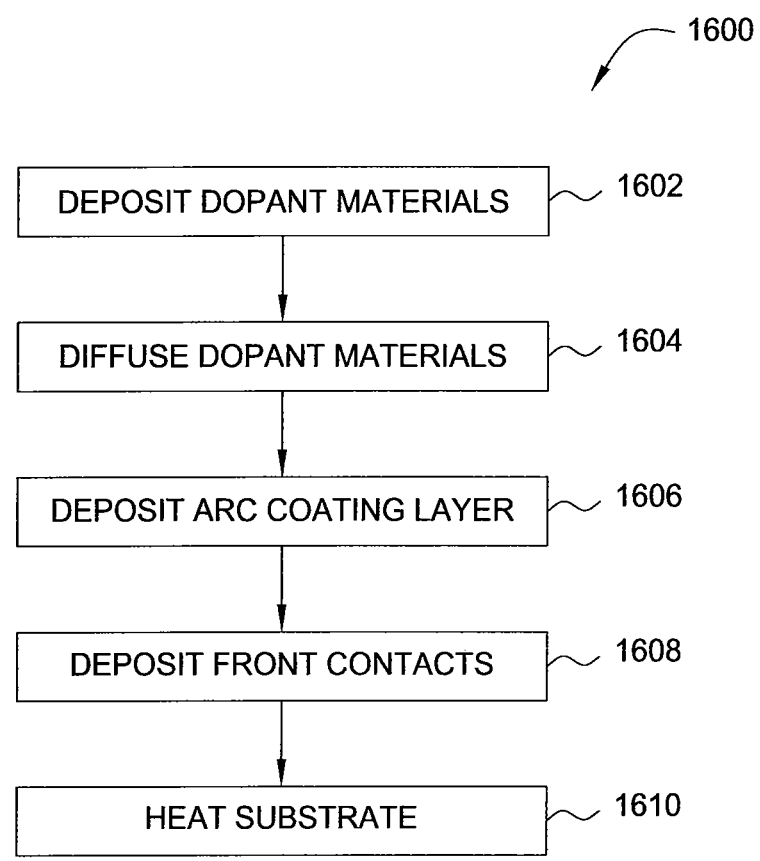
FIG. 15 illustrate a flow chart of methods to form active regions of a solar cell device according to embodiment of the invention.

At box 1602, as shown in FIGS. 14A and 15, a first dopant material 1419 is deposited on the front surface 1401 of the substrate 1410. In one embodiment, the first dopant material 1419 is deposited or printed in a desired pattern by the use of ink jet printing, rubber stamping, screen printing, or other similar process. The first dopant material 1419 may initially be a liquid, paste, or gel that will be used to form a doped region. In some cases, after disposing the first dopant material 1419, the substrate is heated to a desirable temperature to assure that the first dopant material 1419 will remain on the front surface 1401, and cause the dopant material 1419 to cure, densify, and/or form a bond with the front surface 1401. In one embodiment, the first dopant material 1419 is a gel or paste that contains an n-type dopant that is used to heavily dope the substrate 1410. Typical n-type dopants used in silicon solar cell manufacturing are elements, such as, phosphorus (P), arsenic (As), or antimony (Sb). In one embodiment, the first dopant material 1419 is phosphorous containing dopant paste that is deposited on the front surface 1401 of the substrate 1410 and the substrate is heated to a temperature of between about 80° C. and about 500° C. In one embodiment, the first dopant material 1419 may contain materials selected from a group consisting of polyphosphoric acid, phosphosilicate glass precursors, phosphoric acid ($H_3PO_4$), phosphorus acid ($H_3PO_3$), hypophosphorous acid ($H_3PO_2$), and/or various ammonium salts thereof. In one embodiment, the first dopant material 1419 is a gel or paste that contains between about 6 and about 30 atomic % of phosphorous.

The process described in box 1602 may be performed by in a screen print chamber 102 that is positioned within the system 100, as previously discussed and shown in FIG. 3A. In one embodiment, the doping layer is deposited on the substrate using a screen printing process performed in a Softline™ tool available from Baccini S.p.A., which is owned by Applied Materials, Inc. of Santa Clara, Calif. An example of the screen print chamber 102 and system 100 are further disclosed in detail in U.S. Provisional patent application Ser. No. 12/418,912, entitled "NEXT GENERATION SCREEN PRINTING SYSTEM"), filed on Apr. 6, 2009, and U.S. Patent Publication No. 2009/0142880, entitled "SOLAR CELL CONTACT FORMATION PROCESS USING A PATTERNED ETCHANT MATERIAL," filed on Nov. 19, 2008, which are incorporated by reference above.

At box 1604, as shown in FIGS. 14B and 15, the substrate is heated to a temperature greater than about 750° C. to causes the doping elements in the first dopant material 1419 to diffuse into the front surface 1401 of the substrate 1410, thereby forming a heavily doped region 1420 within the substrate 1410. Each of the formed heavily doped regions 1420 can thus be used as heavily doped region where a good electrical connection can be made to the front surface of the solar cell 1400. In one example, it is desirable for the formed heavily doped region 1420 to have a sheet resistance between about 10-50 Ohms per square. In one embodiment of the processes performed at box 1604, the substrate is heated to a temperature between about 750° C. and about 1300° C. in the presence of nitrogen ($N_2$), oxygen ($O_2$), hydrogen ($H_2$), air, or combinations thereof for between about 1 minute and about 120 minutes. In one example, the substrate is heated in a rapid thermal annealing (RTA) chamber in a nitrogen ($N_2$) rich environment to a temperature of about 1000° C. for about 5 minutes.

In one embodiment of the processes performed in box 1604, the regions of the front surface 1401 of the substrate 1410 between the deposited first dopant material 1419 are doped with a desired dopant atom (e.g., n-type dopant) to form a doped region 1430. In one embodiment, during a portion of the process of driving in the first dopant material 1419 into the front surface 1401 of the substrate, the front surface is exposed to a dopant containing vapor or gas to form the doped region 1430. In one example, at least a portion of the dopant containing vapor is created by the vaporization of some of the first dopant material 1419 during the thermal processing. In another example, the front surface 1401 is exposed to phosphoric acid during thermal processing to form the doped region 1430 in an n-type solar cell substrate. In yet another example, the front surface 1401 of the substrate is exposed to $POCl_3$, or other desirable dopant containing gas while the substrate is thermally processed in a tube furnace. Although not shown here, one will note that the contact layer 1414 is believed to advantageously form a reliable mask that can prevent the back surface 1402 from being doped with any unwanted dopant containing vapors that is used to form, or is a by-product of forming, the heavily doped region 1420 and the doped region 1430. In one example, it is desirable for the formed doped region 1430 to have a sheet resistance between about 80-200 Ohms per square.

The drive-in process described in box 1604 may be performed by the heat treatment module, or second processing module, that may be attached to the system 100. In one embodiment, the heat treatment module is a rapid thermal annealing (RTA) chamber such as a Vantage Radiance Plus™ RTP chamber available from Applied Materials Inc. of Santa Clara, Calif. Other processing chambers such as an annealing chamber, a tube furnace or belt furnace chamber may also be used to practice the present invention. In one embodiment, the processing chamber is contained in a processing module disposed within a SoftLine™ tool available from Baccini S.p.A, which is a division of Applied Materials Inc. of Santa Clara, Calif.

At box 1606, as shown in FIGS. 14C and 15, an antireflection layer 1431 is formed on the front surface 1401 of the substrate. In one embodiment, the antireflection layer 1431 comprises a thin passivation/antireflection layer (e.g., silicon nitride, silicon oxide). While FIG. 14C illustrates an antireflection layer 1431 that is a single layer this configuration is not intended to be limiting as to the scope of the invention described herein, and is only intended to illustrate one example of an antireflection layer. In one example, the thin passivation/antireflection layer comprises two or more layers that comprise silicon nitride, or silicon dioxide or silicon nitride. The deposition of the antireflection layer described in box 1606 may be performed by the fourth deposition processing module that is positioned within the system 100. In one embodiment, the antireflection layer is deposited using a PVD chamber or a CVD chamber. The antireflection layer may be formed on one or more surfaces of the solar cell substrate using an ATON™ tool available from Applied Materials in Santa Clara, Calif., as discussed above. In one embodiment, the antireflection layer formation process may be performed by use of a third processing module, for example, a plasma enhanced CVD deposition module that is be attached to the system 100.

At box 1608, as illustrated in FIGS. 14D and 15, a patterned conducting layer 1432 is deposited over the antireflection layer 1431. In one embodiment, the formed conducting layer 1432 is between about 2000 angstroms (Å) and about 50,000 angstroms (Å) thick and contains a metal. In one embodiment, the formed conducting layer 1432 is formed from a metal containing paste, such as silver (Ag) containing paste that is screen printed on the front surface 1401 of the substrate. In one embodiment, a desired pattern of the conducting layer 1432 is deposited over the formed heavily doped regions 1420, so that the conducting layer 1432 will form a good electrical contact with the heavily doped regions 1420 after a subsequent thermal process is performed at box 1610. In one embodiment, it is desirable to remove portions of the antireflection layer 1431 disposed over the heavily doped regions 1420 prior to depositing the conducting layer 1432 on the heavily doped regions 1420. In general the processes of aligning and positioning the conducting layer 1432 with the heavily doped regions 1420 can use one or more of the processes described above, such as the process sequence 700 illustrated in FIG. 7. In one embodiment, the conducting layer 1432 is a silver containing material that is deposited in a desired pattern by use of a screen printing process, ink jet printing, or other similar process in a fourth processing module coupled to the system 100.

The deposition of the conducting layer described in box 1608 may be performed by a fourth deposition processing module that is positioned on the system 100. The fourth deposition processing module may include but is not limited to physical vapor deposition (PVD) chambers, sputtering chambers, chemical vapor deposition (CVD) chambers, plasma enhanced chemical vapor deposition (PECVD) chambers. In one embodiment, the conducting layer is deposited using a PVD chamber available from Applied Materials, Inc., located in Santa Clara, Calif. Other processing chambers, such as hot wire chemical vapor deposition (HWCVD) chambers, ion implant/doping chambers, atomic layer deposition (ALD) chambers, or rapid thermal oxidation (RTO) chamber, etc., may also be used to practice the present invention.

At box 1610, the substrate is generally heated to a temperature greater than 400° C. and/or less than about 800° C. to causes the conducting layer 1432 to densify and/or diffuse into the front surface 1401 of the substrate 1410 to form a desirable Ohmic-contact with portions of the heavily doped region 1420. In one embodiment of the processes performed at box 1610, the substrate is heated to a temperature between about 400° C. and about 500° C. in the presence of nitrogen ($N_2$), oxygen ($O_2$), hydrogen ($H_2$), air, or combinations thereof for between about 1 minute and about 120 minutes. In one embodiment, the substrate is heated in the fifth deposition processing module that is positioned within the system 100. In one example, the fifth deposition processing module is a processing chamber disposed within a SoftLine™ tool available from Baccini S.p.A, which is a division of Applied Materials Inc. of Santa Clara, Calif., as discussed above. Alternatively, the heat treatment module that is positioned within the system 100 may be used to heat the substrate. In such a case, an annealing chamber, a tube furnace or belt furnace chamber may be used. The embodiments described herein have advantage over other conventional techniques, since the formed electrical connection between the conducting layer 1432 will have a low contact resistance and will not damage the formed solar cell junction by "spiking" through formed emitter to the underlying p-type material. In the configurations disclosed herein the conducting layers 1432 are fired through antireflection layer, and/or dielectric layer, using a firing furnace module that is positioned on the system 100. In one example, the firing furnace module is a furnace that is adapted to heat the substrate to a desired temperature to form a desirable contact with the patterned metal layers formed on the substrate surfaces. An example of an exemplary firing furnace module is further disclosed in detail in U.S. Provisional Patent Application Ser. No. 61/157,179, entitled "CRYSTALLINE SILICON SOLAR CELL PRODUCTION LINE HAVING A WAFER SAWING MODULE"), filed on Mar. 3, 2009, which is incorporated herein by reference above.

Although the processing sequence 1600 provided above described an alternate manner of forming active regions of the solar cell device, the amount and sequence of the processing steps described above are not intended to be limiting as to the scope of the invention described herein. In one example, the first dopant material 1419 is deposited on a lightly doped, or moderately doped, n-type region formed in the p-type doped substrate 1410 in a separate processing step prior to step 1602. In another example, process step 1606 may be performed prior to the process steps 1602-1604.

While most of the discussion above primarily discusses the use of a screen printing chamber and system to help describe one or more of the embodiments of the present invention this configuration is not intended to limiting as to the scope of the invention, since other patterned material deposition processes and systems may be used in conjunction with the optical inspection system and solar cell processing methods described herein without deviating from the basic scope of the invention described herein.

While the foregoing is directed to embodiments of the present invention, other and further embodiments of the invention may be devised without departing from the basic scope thereof, and the scope thereof is determined by the claims that follow.

The invention claimed is:

1. A solar cell formation process, comprising:
    positioning a substrate on a substrate receiving surface, wherein the substrate has a first surface and a patterned doped region formed thereon;
    determining the actual position of the patterned doped region on the substrate, wherein determining the actual position comprises:
        emitting electromagnetic radiation towards the first surface; and
        receiving electromagnetic radiation at a first wavelength from a region of the first surface;
    aligning one or more features in a screen printing mask to the patterned doped region using information received from the determined actual position of the patterned doped region on the substrate; and
    depositing a layer of material through the one or more features and onto at least a portion of patterned doped region after aligning the one or more features to the patterned doped region.

2. The solar cell formation process of claim 1, wherein the layer comprises a conductive material, the substrate comprises silicon, and the patterned doped region has a dopant concentration greater than about $1 \times 10^{18}$ atoms/cm$^3$.

3. The solar cell formation process of claim 1, wherein receiving electromagnetic radiation at a first wavelength is performed by an optical detector that is positioned adjacent to the first surface and the emitted electromagnetic radiation is provided to a second surface that is opposite the first surface.

4. The solar cell formation process of claim 1, wherein the determining the actual position of the patterned doped region comprises capturing an optical image of two or more alignment marks disposed on a surface of the substrate, and determining the difference in position of each of alignment marks to an ideal position to determine the offset based on the optical image.

5. The solar cell formation process of claim 4, wherein the ideal position of the alignment marks is determined with respect to the at least one feature of the substrate prior to printing the first layer.

6. The solar cell formation process of claim 4, wherein at least three alignment marks are formed on the surface of the substrate using a screen printing process.

7. The solar cell formation process of claim 6, wherein the comparing the actual position of the alignment marks comprises constructing a first reference line between two of the alignment marks and constructing a second reference line between a third alignment mark and the first reference line, wherein the second reference line is perpendicular to the first reference line.

8. The solar cell formation process of claim 1, wherein positioning a substrate on a substrate receiving surface comprises:
- receiving a substrate on a first surface of a support material;
- moving the support material across a surface of the substrate support using an actuator coupled to the supporting material; and
- evacuating a region behind the first surface of the support material to hold the substrate disposed on the first surface against the substrate support; and
- aligning features in a screen printing mask to the patterned doped region further comprises positioning the substrate held on the first surface of the support material under the screen printing mask.

9. The solar cell formation process of claim 1, wherein determining the actual position of the patterned doped region on the substrate further comprises:
- positioning the substrate receiving surface or a screen printing mask so that a portion of the emitted electromagnetic radiation passes through one or more features formed in the screen printing mask and the first surface of the substrate disposed on the substrate receiving surface before it is received by a detector,
- wherein aligning the one or more features in a screen printing mask to the patterned doped region comprises adjusting the position of the feature formed in the screen printing mask to a portion of the patterned doped region formed on the substrate.

10. The solar cell formation process of claim 9, wherein the portion of the patterned doped region formed on the substrate comprises two or more nested elements that have a gap formed there between, wherein at least one of the two or more nested elements has a first width, and the feature formed in the screen printing mask has a second width that is smaller than the first width.

11. The solar cell formation process of claim 9, wherein determining the actual position of the patterned doped region on the substrate further comprises detecting the variation in intensity of the emitted electromagnetic radiation received by the detector from two or more regions of the patterned doped region.

12. A solar cell formation process, comprising:
- disposing a masking material in a pattern on a first surface of a substrate;
- etching a portion of the first surface while the masking material is disposed on the first surface, wherein the masking material substantially inhibits the etching of a plurality of regions of the first surface over which the masking material is disposed;
- capturing an optical image of a portion of the first surface;
- aligning features in a screen printing mask to at least a portion of the plurality of regions using the information received from the captured optical image; and
- depositing a layer of material through the features and onto at least a portion of the plurality of regions.

13. The solar cell formation process of claim 12, wherein the masking material comprises a first dopant material.

14. The solar cell formation process of claim 13, further comprising:
- heating the substrate and masking material to cause the first dopant material to diffuse into the first surface and form a patterned doped region, wherein heating the substrate and the masking material is performed after etching the portion of the first surface.

15. The solar cell formation process of claim 13, further comprising diffusing an amount of the first dopant material into a portion of the first surface after etching a portion of the first surface.

16. The solar cell formation process of claim 12, wherein capturing an optical image of a portion of the first surface comprises capturing an optical image of two or more alignment marks disposed on a surface of the substrate, and determining the difference in position of each of alignment marks to an ideal position to determine the offset based on the optical image.

17. The solar cell formation process of claim 14, wherein the substrate comprises silicon and the patterned doped region has a dopant concentration greater than about $1 \times 10^{18}$ atoms/cm$^3$.

18. The solar cell formation process of claim 12, further comprising:
- heating the substrate and masking material to cause a first dopant material disposed in the masking material to diffuse into the first surface and form a patterned doped region, wherein capturing an optical image of a portion of the patterned doped region comprises:
  - emitting electromagnetic radiation towards the first surface; and
  - receiving electromagnetic radiation at a wavelength between about 850 nm and about 4 μm from a region of the first surface.

19. The solar cell formation process of claim 12, wherein capturing the optical image of the portion of the patterned doped region further comprises noting the difference in the intensity of the electromagnetic radiation reflected from or transmitted through a portion of the first surface that was covered by the masking layer and a portion of the first surface that was not covered by the masking layer during the process of etching a portion of the first surface.

20. The solar cell formation process of claim 12, further comprising:
- diffusing a first amount of a first dopant atom into the first surface of the substrate to form a first doped region before disposing the masking material on the first surface; and
- diffusing a second amount of a second dopant atom into the first surface to form a second doped region after disposing the masking material on the first surface and etching the portion of the first surface.

21. The solar cell formation process of claim 20, wherein the first dopant atom and second dopant atom are each selected from a group of elements consisting of phosphorous, arsenic antimony, boron, aluminum and gallium.

22. The solar cell formation process of claim 20, wherein the first dopant atom and the second dopant atom are the same type of dopant atom, and the first amount of the first dopant atom in the first doped region is greater than the second amount of the second dopant atom in the second doped region.

23. A solar cell formation process, comprising:
- etching a portion of a first surface of a substrate;
- depositing a first layer over a portion of the etched first surface;
- removing a portion of the deposited first layer disposed over the etched first surface to expose a region of the substrate;

delivering a dopant containing material to the exposed region of the substrate to form a doped region within the substrate;

capturing an image of a portion of the first surface of the substrate, wherein the image comprises a portion of the exposed region and a portion of the etched first surface;

aligning features in a screen printing mask to the exposed region using information received from the captured image; and depositing a layer of material through the features and onto at least a portion of the patterned doped region after they are aligned to the exposed region.

24. The solar cell formation process of claim 23, wherein capturing an image of a portion of the first surface comprises capturing an optical image of two or more alignment marks disposed on a surface of the substrate, and determining the difference in position of each of alignment marks to an ideal position to determine the offset based on the optical image.

25. The solar cell formation process of claim 23, wherein capturing an optical image of a portion of the patterned doped region comprises:

emitting electromagnetic radiation towards the first surface; and receiving electromagnetic radiation at a wavelength between about 850 nm and about 4 µm from a region of the first surface.

26. The solar cell formation process of claim 23, wherein the first layer comprises a material selected from a group consisting of silicon nitride (SiN), amorphous silicon (a-Si) and silicon dioxide ($SiO_2$).

27. The solar cell formation process of claim 23, wherein the first layer comprises a second layer disposed over the first surface of the substrate and a third layer disposed over the second layer, wherein the second layer comprises a material selected from a group consisting of silicon nitride (SiN) and silicon dioxide ($SiO_2$), and the third layer comprises amorphous silicon (a-Si).

* * * * *

UNITED STATES PATENT AND TRADEMARK OFFICE
CERTIFICATE OF CORRECTION

PATENT NO. : 8,673,679 B2
APPLICATION NO. : 13/133919
DATED : March 18, 2014
INVENTOR(S) : Marco Galiazzo et al.

It is certified that error appears in the above-identified patent and that said Letters Patent is hereby corrected as shown below:

Title Page, item (12)

Please delete "Gallazzo et al." and insert --Galiazzo et al.--.

Title Page, item (75), line 1, Inventors

Please delete "Gallazzo" and insert --Galiazzo-- therefor.

Signed and Sealed this
First Day of July, 2014

Michelle K. Lee
*Deputy Director of the United States Patent and Trademark Office*